(12) United States Patent
Ooishi

(10) Patent No.: US 6,928,010 B2
(45) Date of Patent: Aug. 9, 2005

(54) SEMICONDUCTOR INTEGRATED CIRCUIT DEVICE CAPABLE OF TUNING OF INTERNAL POWER SUPPLY VOLTAGES GENERATED BY A PLURALITY OF INTERNAL POWER GENERATING CIRCUITS

(75) Inventor: Tsukasa Ooishi, Hyogo (JP)

(73) Assignee: Renesas Technology Corp., Tokyo (JP)

(*) Notice: Subject to any disclaimer, the term of this patent is extended or adjusted under 35 U.S.C. 154(b) by 545 days.

(21) Appl. No.: 10/207,042

(22) Filed: Jul. 30, 2002

(65) Prior Publication Data

US 2003/0042485 A1 Mar. 6, 2003

(30) Foreign Application Priority Data

Sep. 3, 2001 (JP) .......................................... 2001-266009

(51) Int. Cl.$^7$ ............................................. G11C 29/00
(52) U.S. Cl. ........................ 365/201; 365/145; 365/171; 365/189.07; 365/189.09; 365/191
(58) Field of Search .............................. 365/201, 145, 365/171, 189.07, 189.09, 191

(56) References Cited

U.S. PATENT DOCUMENTS 6,549,480 B2 * 4/2003 Hosogane et al. .......... 365/226

FOREIGN PATENT DOCUMENTS

JP  7-140208  6/1995

* cited by examiner

Primary Examiner—Richard Elms
Assistant Examiner—Pho M. Luu
(74) Attorney, Agent, or Firm—McDermott Will & Emery LLP

(57) ABSTRACT

A semiconductor integrated circuit device includes a plurality of internal circuits, an internal power supply potential generating circuit for converting a level of an external power supply potential to supply an internal power supply potential at a level according to a level set signal, a control portion for successively applying said plurality of level set signals to each internal potential generating circuit for successively producing a plurality of internal potentials at different levels in a test operation, and a measuring circuit for making a comparison between each internal potential and a reference potential, and holding information representing results of the comparison.

16 Claims, 21 Drawing Sheets

FIG.6

| STEP | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| P0 | 0 | 1 | 0 | 1 | 0 | 1 | 0 | 1 | 0 | 1 | 0 | 1 | 0 | 1 | 0 | 1 |
| P1 | 0 | 0 | 1 | 1 | 0 | 0 | 1 | 1 | 0 | 0 | 1 | 1 | 0 | 0 | 1 | 1 |
| P2 | 0 | 0 | 0 | 0 | 1 | 1 | 1 | 1 | 0 | 0 | 0 | 0 | 1 | 1 | 1 | 1 |
| P3 | 1 | 1 | 1 | 1 | 1 | 1 | 1 | 1 | 0 | 0 | 0 | 0 | 0 | 0 | 0 | 0 |
| VRI' | -8 | -7 | -6 | -5 | -4 | -3 | -2 | -1 | 0 | +1 | +2 | +3 | +4 | +5 | +6 | +7 |
| φ310 | L | L | L | L | L | L | H | H | H | H | H | H | H | H | H | H |

FIG.14

| STEP | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| OUTPUT OF COMPARING CIRCUIT (BLOCK BA) | 0 | 0 | 0 | 0 | 0 | 0 | 0 | 0 | 0 | 0 | 0 | 0 | 1 | 1 | 1 | 1 |
| OUTPUT OF COMPARING CIRCUIT (BLOCK BB) | 0 | 0 | 0 | 0 | 0 | 0 | 0 | 0 | 0 | 1 | 1 | 1 | 1 | 1 | 1 | 1 |
| OUTPUT OF COMPARING CIRCUIT (BLOCK BC) | 0 | 0 | 0 | 0 | 0 | 0 | 0 | 1 | 1 | 1 | 1 | 1 | 1 | 1 | 1 | 1 |
| OUTPUT OF COMPARING CIRCUIT (BLOCK BD) | 0 | 0 | 0 | 0 | 0 | 0 | 0 | 0 | 0 | 0 | 1 | 1 | 1 | 1 | 1 | 1 |
| EXTRACTION OF AVERAGE | 0 | 0 | 0 | 0 | 0 | 0 | 0 | 0 | 0 | 1 | 1 | 1 | 1 | 1 | 1 | 1 |
| EXTRACTION OF MAXIMUM VALUE | 0 | 0 | 0 | 0 | 0 | 0 | 0 | 0 | 0 | 0 | 0 | 0 | 1 | 1 | 1 | 1 |
| EXTRACTION OF MINIMUM VALUE | 0 | 0 | 0 | 0 | 0 | 0 | 0 | 1 | 1 | 1 | 1 | 1 | 1 | 1 | 1 | 1 |

FIG.17

| STEP | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| OUTPUT OF COMPARING CIRCUIT (1ST TIMING) | 0 | 0 | 0 | 0 | 0 | 0 | 0 | 0 | 0 | 0 | 0 | 0 | 1 | 1 | 1 | 1 |
| OUTPUT OF COMPARING CIRCUIT (2ND TIMING) | 0 | 0 | 0 | 0 | 0 | 0 | 0 | 0 | 0 | 1 | 1 | 1 | 1 | 1 | 1 | 1 |
| OUTPUT OF COMPARING CIRCUIT (3RD TIMING) | 0 | 0 | 0 | 0 | 0 | 0 | 0 | 1 | 1 | 1 | 1 | 1 | 1 | 1 | 1 | 1 |
| OUTPUT OF COMPARING CIRCUIT (4TH TIMING) | 0 | 0 | 0 | 0 | 0 | 0 | 0 | 0 | 0 | 0 | 1 | 1 | 1 | 1 | 1 | 1 |
| EXTRACTION OF AVERAGE | 0 | 0 | 0 | 0 | 0 | 0 | 0 | 0 | 0 | 1 | 1 | 1 | 1 | 1 | 1 | 1 |
| EXTRACTION OF MAXIMUM VALUE | 0 | 0 | 0 | 0 | 0 | 0 | 0 | 0 | 0 | 0 | 0 | 0 | 1 | 1 | 1 | 1 |
| EXTRACTION OF MINIMUM VALUE | 0 | 0 | 0 | 0 | 0 | 0 | 0 | 1 | 1 | 1 | 1 | 1 | 1 | 1 | 1 | 1 |

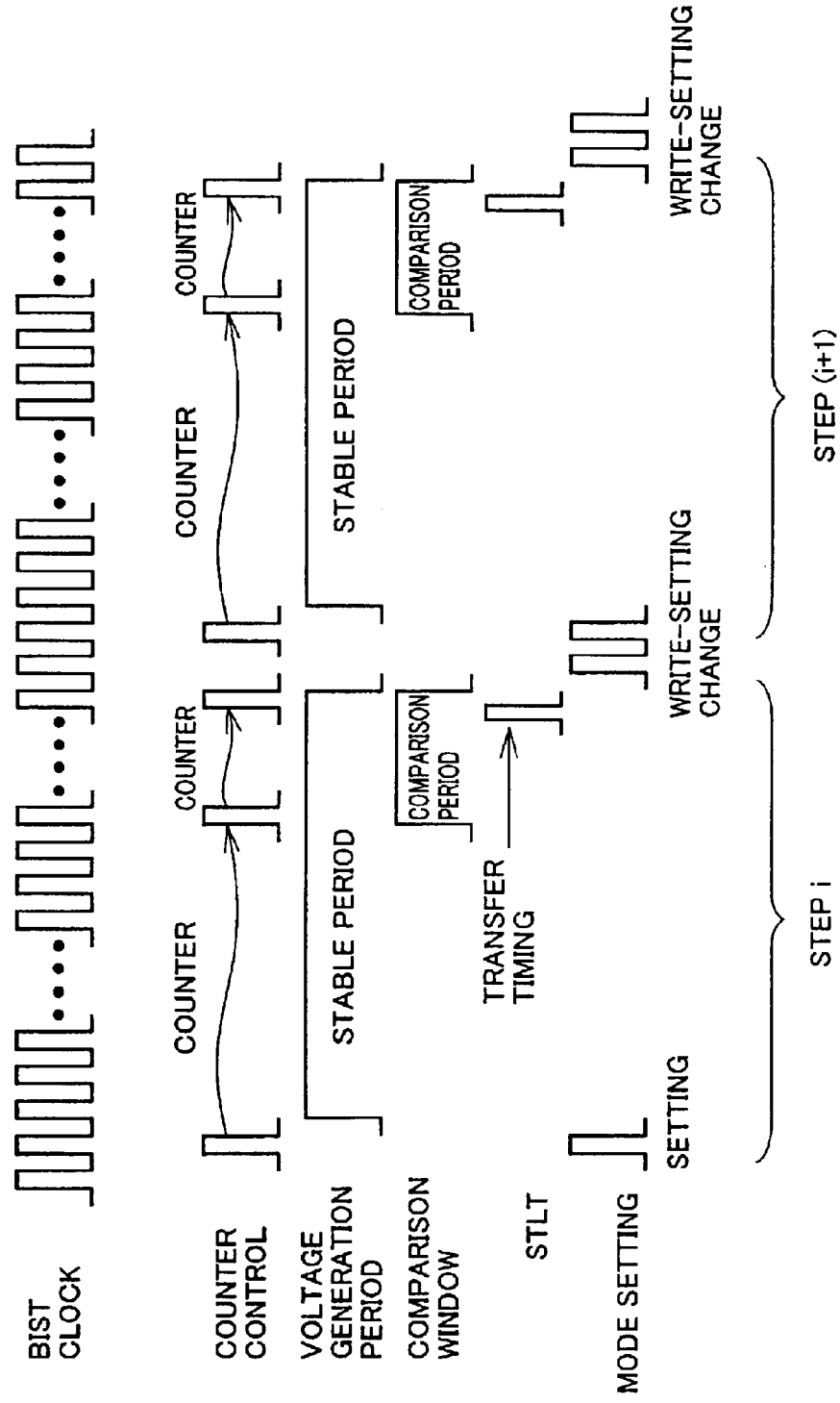

SEMICONDUCTOR INTEGRATED CIRCUIT DEVICE CAPABLE OF TUNING OF INTERNAL POWER SUPPLY VOLTAGES GENERATED BY A PLURALITY OF INTERNAL POWER GENERATING CIRCUITS

BACKGROUND OF THE INVENTION

1. Field of the Invention

The present invention relates to a semiconductor integrated circuit device, and particularly to a semiconductor integrated circuit device provided with an internal potential generating circuit, which allows external tuning of an internal power supply potential.

2. Description of the Background Art

A conventional semiconductor integrated circuit device is provided with an internal power supply potential for producing an internal power supply potential, which is lower or higher than an external power supply potential, and applying it to internal circuits. Since the output potential of the internal power supply potential generating circuit varies due to variations in manufacturing process and others, the device is generally configured to allow tuning of the output potential of the internal power supply potential generating circuit.

In the prior art, however, the output potential of the internal power supply potential generating circuit is tuned while monitoring it by an external tester. Therefore, the tuning is not easy.

In recent years, a system LSI or the like may be provided with internal power supply potential generating circuits for supplying different internal power supply potentials to internal circuits having different functions, respectively. In this structure, it is necessary to tune the output potential levels of the plurality of internal power supply potential generating circuits while monitoring these output potential levels by a tester. This increases the difficulty in tuning.

SUMMARY OF THE INVENTION

An object of the invention is to provide a semiconductor integrated circuit device, which allows easy tuning of internal power supply potentials produced by a plurality of internal power supply potential generating circuits.

In summary, the present invention provides a semiconductor integrated circuit device including a plurality of internal circuits, at least one internal potential generating circuit, at least one measuring circuit and a transmitting circuit.

The internal potential generating circuit is provided corresponding to the plurality of internal circuits and generates an internal potential. The measuring circuit operates in a test operation to compare the internal potential generated by the internal potential generating circuit with a reference potential. The measuring circuit includes a storage circuit holding information representing the result of comparison. The transmitting circuit transmits the result of comparison stored in the storage circuit.

Preferably, each of the internal potential generating circuits receives a level set signal including information representing a level of the internal potential, and generates the internal potential at a level corresponding to the level set signal. Each of the measuring circuits is provided corresponding to the internal potential generating circuit and compares the internal potential generated by the internal potential generating circuit according to the level set signal with the reference potential corresponding to the level set signal in the test operation. The measuring circuits perform in parallel the comparison between the internal potentials and the reference potentials.

Preferably, each of the measuring circuits includes a comparing circuit and a switch circuit. The comparing circuit receives the internal potential generated by the internal potential generating circuit and the reference potential on first and second input nodes thereof, respectively, and outputs the results of comparison. The switch circuit is capable of switching the potentials applied to the first and second input nodes between the internal potential and the reference potential.

According to another aspect of the present invention, a semiconductor integrated circuit device comprises an internal circuit, an internal potential generating circuit, a measuring circuit and a transmitting circuit.

The internal circuit is divided into a plurality of circuit blocks. The internal potential generating circuit is provided corresponding to the internal circuit and generates an internal potential. The measuring circuit operates in a test operation to compare the internal potential generated by the internal potential generating circuit with a reference potential. The measuring circuit includes a plurality of comparing circuits each provided corresponding to one of the plurality of circuit blocks for comparing the internal potentials supplied from the internal potential generating circuit to the plurality of circuit blocks with the reference potential. The transmitting circuit transmits the results of comparison from the plurality of comparing circuits.

According to yet another aspect of the present invention, a semiconductor integrated circuit device comprises an internal circuit, at least one internal potential generating circuit, at least one measuring circuit and a transmitting circuit.

The internal potential generating circuit is provided corresponding to the internal circuit and generates an internal potential. The measuring circuit operates in a test operation to compare the internal potential generated by the internal potential generating circuit with a reference potential for a predetermined time period. The transmitting circuit transmits the result of comparison from the measuring circuit.

Accordingly, the invention has the following advantage. In the structure having the plurality of internal potential generating circuits corresponding to the plurality of internal circuits, the internal potential can be easily tuned based on results of the comparison by the measuring circuit.

The invention also has such an advantage that the potentials applied to the first and second input nodes of the comparing circuit can be switched between the internal potential and the reference potential. Therefore, it is possible to prevent such a situation that offset of comparison characteristics of the comparing circuit impedes the comparison with sufficiently high accuracy.

The invention further has the following advantage. In the structure having the internal circuits each divided into the plurality of circuit blocks, the level set signal for controlling each internal circuit can be set by a self-test.

The invention further has such an advantage that results of the comparison made over a predetermined period can be reflected on the measuring, and therefore the accuracy of the level set signal for the internal potential generating circuit can be further improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows, by way of example, signals P0–P3 representing tuning information and a relative value VRI' of an internal reference potential VRI and an output signal of comparing circuit 310;

FIG. 14 conceptually represents an operation of measuring circuit 304.1 of the third embodiment;

FIG. 17 conceptually represents an operation of measuring circuit 304.1;

FIG. 21 is a timing chart showing an operation of comparator 318.

DESCRIPTION OF THE PREFERRED EMBODIMENTS

Embodiments of the invention will now be described with reference to the drawings.

Figure 1:
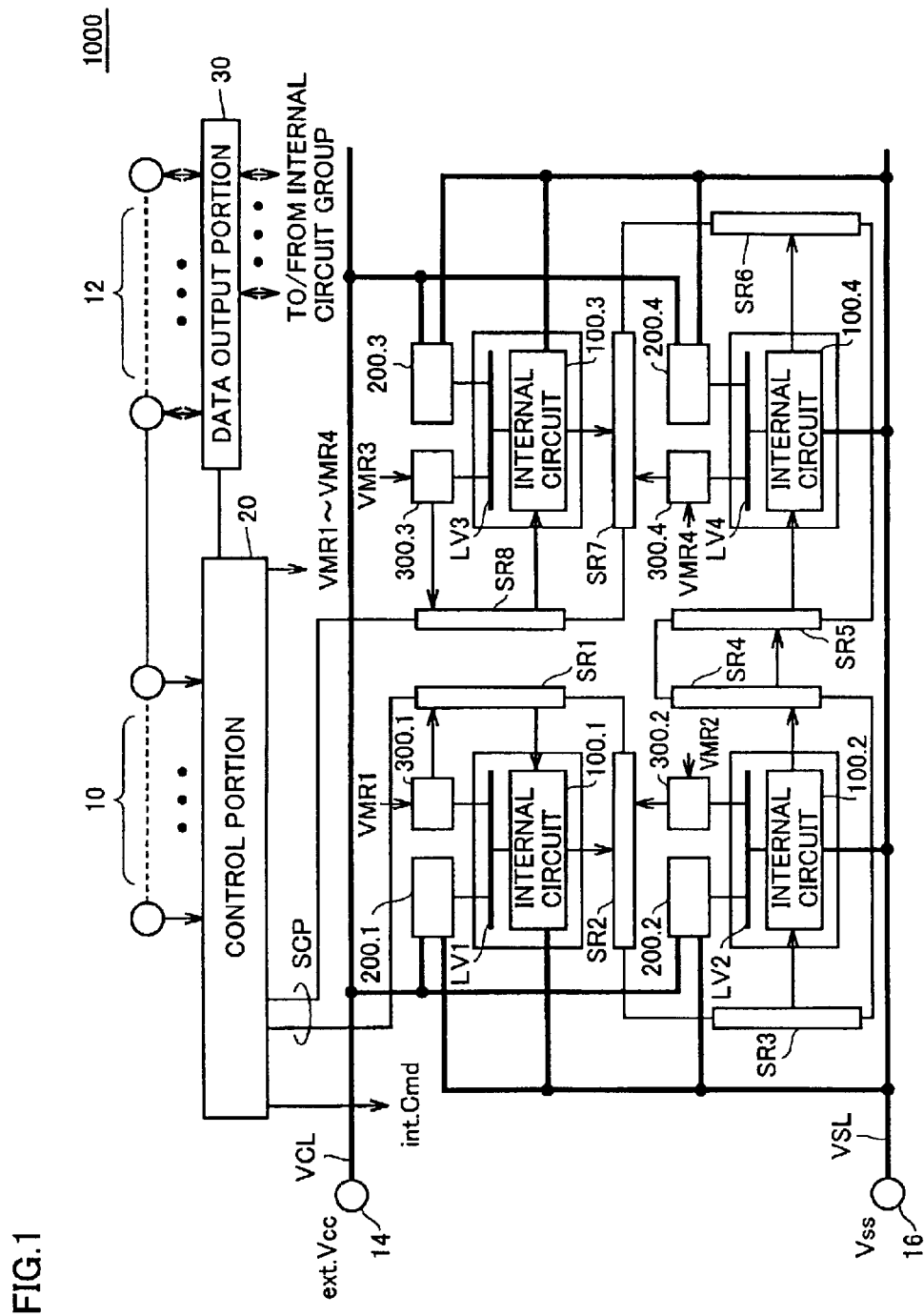
FIG. 1 is a schematic block diagram showing a circuit structure of a semiconductor integrated circuit device 1000 of a first embodiment of the invention.

FIG. 1 is a schematic block diagram showing a circuit structure of a semiconductor integrated circuit device 1000 of a first embodiment of the invention.

Referring to FIG. 1, semiconductor integrated circuit device 1000 includes a control signal input terminal group 10 for externally receiving control signals, a data I/O terminal group 12 for externally sending and receiving data, a power supply terminal 14 for externally receiving an external power supply potential ext.Vcc, a ground terminal 16 for externally receiving ground voltage Vss, a control portion 20 for controlling an operation of semiconductor integrated circuit device 1000 based on a signal sent from external control signal input terminal group 10, a data I/O portion 30 for externally sending and receiving data via data I/O terminal group 12, internal circuits 100.1–100.4, which are controlled by control portion 20 to perform data transmission to and from data I/O portion 30 as well as data transmission to and from each other, and to perform predetermined data processing, a power supply interconnection VCL for transmitting an external power supply potential ext.Vcc from power supply terminal 14 to internal circuits 100.1–100.4, and a ground interconnection VSL for transmitting ground voltage Vss from ground terminal 16 to internal circuits 100.1–100.4. Although FIG. 1 shows the four internal circuits for the sake of illustration, the internal circuits may be more or fewer than four in number.

Semiconductor integrated circuit device 1000 further includes internal power supply potential generating circuits 200.1–200.4, which are arranged between internal circuits 100.1–100.4 and power supply interconnection VCL for raising or lowering external power supply potential ext.Vcc to supply the raised or lowered voltages to corresponding internal circuits 100.1–100.4, respectively, internal power supply interconnections LV1–LV4 for transmitting the internal power supply potentials supplied from internal power supply potential generating circuits 200.1–200.4 to internal circuits 100.1–100.4, respectively, and measuring circuits 300.1–300.4, which are provided corresponding to internal circuits 100.1–100.4 for receiving measurement reference potentials VMR1–VMR4 supplied from control portion 20, measuring the potential levels of internal power supply interconnections LV1–LV4 in the corresponding internal circuits and outputting results of the measurement, respectively. Each of the potential levels produced by internal power supply potential generating circuits 200.1–200.4 may be different from the others, or may be equal to one, some or all of the others.

Control portion 20 issues an internal control signal int.Cmd to internal circuits 100.1–100.4 for controlling the operations of internal circuits 100.1–100.4, respectively.

Semiconductor integrated circuit device 1000 further has a scan path SCP for successively and serially transmitting test signals, which are to be applied to internal circuits 100.1–100.4, respectively, from control portion 20, receiving signals produced as a result of the test operations from internal circuits 100.1–100.4 as well as data to be transmitted mutually between internal circuits 100.1–100.4, and serially transmitting the received signals and data to control portion 20. Scan path SCP is provided with shift registers SR1–SR8 for transmitting the data to be applied to internal circuits 100.1–100.4, receiving the data output from internal circuits 100.1–100.4, and serially transmitting the received data.

Figure 2:
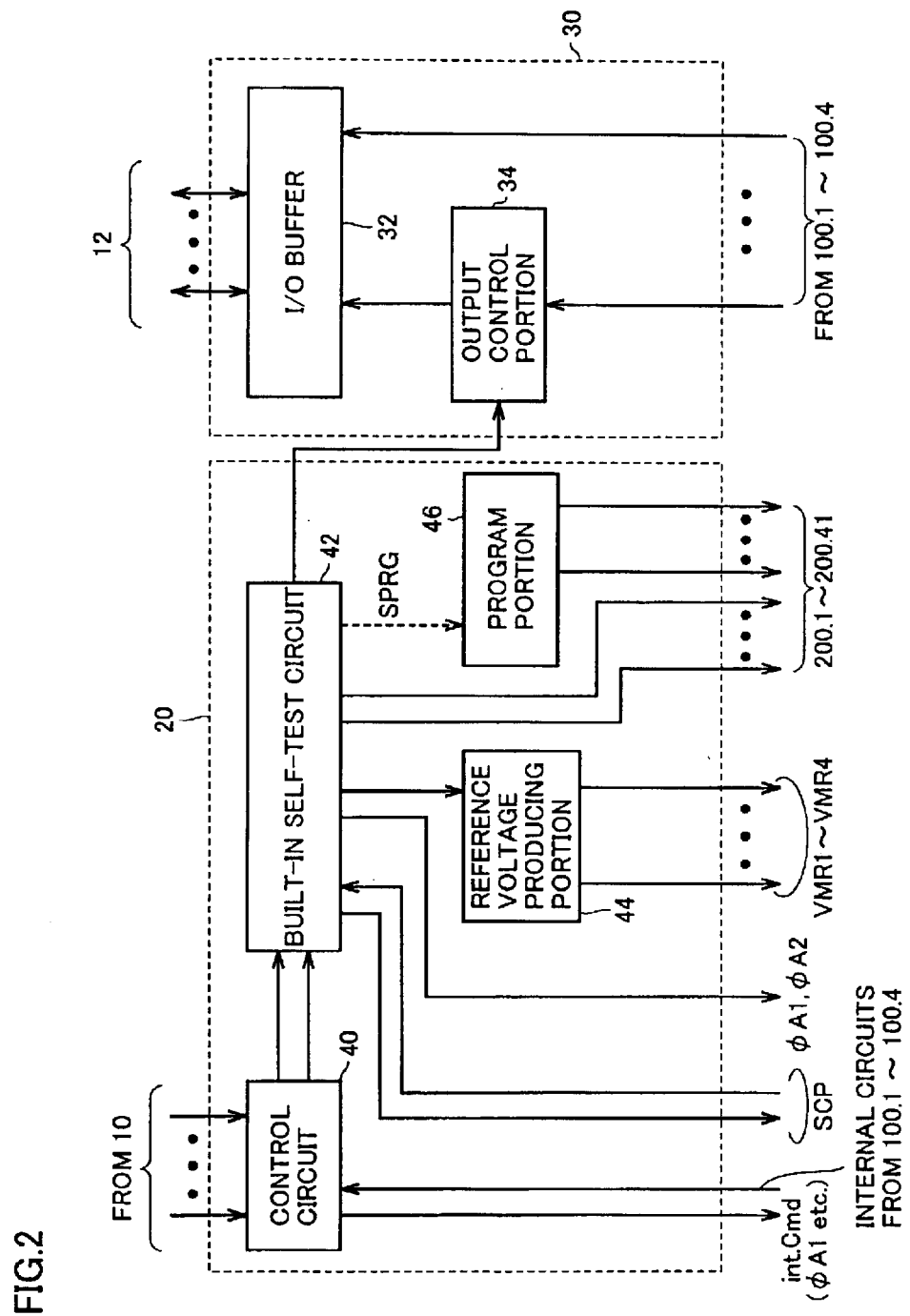
FIG. 2 is a schematic block diagram fragmentarily showing structures of a control portion 20 and a data I/O portion 30 shown in FIG. 1.

FIG. 2 is a schematic block diagram fragmentarily showing structures of control portion 20 and data I/O portion 30 shown in FIG. 1.

Control portion 20 includes a control circuit 40 for operating in accordance with signals, which are applied from control signal input terminal group 10, to output signals for controlling the operations of internal circuits 100.1–100.4 in a normal operation, and to output signals for controlling start and end of a built-in self-test in a test operation, a built-in self-test circuit 42 which starts the built-in self-test in accordance with a signal sent from control circuit 40, transmits data via scan path SCP to and from internal circuits 100.1–100.4, and thereby performing the built-in self-test, a reference voltage producing portion 44 for producing reference voltages VMR1–VMR4 to be applied to measuring circuits 300.1–300.4 under the control of built-in self-test circuit 42, and a program portion 46, which nonvolatilely stores information for tuning the internal power supply potentials produced by internal power supply potential generating circuits 200.1–200.4, and applies program data corresponding to the tuning information to corresponding internal power supply potential generating circuits 200.1–200.4.

During the built-in self-test period, as will be described later, a built-in self-test circuit output signal, which is applied from built-in self-test circuit 42, and will be referred to as a "BIST circuit output signal" hereinafter, controls output potentials of internal power supply potential generating circuits 200.1–200.4 instead of a program portion output signal applied from program portion 46.

The program portion 46 is provided with fuse elements or the like for nonvolatilely storing information for tuning, e.g., by external laser irradiation. Alternatively, program portion 46 may be provided with a nonvolatile storage element for nonvolatilely storing information for tuning by an electric signal SPRG so that the tuning information can be stored in accordance with instructions from built-in self-test circuit 42.

When measuring circuits 300.1–300.4 finish the operations of measuring the operation voltages of internal power supply potential generating circuits 200.1–200.4, built-in self-test circuit 42 receives the data of results of the measurement from measuring circuits 300.1–300.4 via scan path SCP. Thereafter, an output control circuit 34 in data I/O portion 30 externally outputs the data of measurement results received by built-in self-test circuit 42 via an I/O buffer 32 in accordance with an instruction applied from built-in self-test circuit 42.

In the normal operation, I/O buffer 32 externally outputs the data applied from internal circuits 100.1–100.4 via data I/O terminal group 12, and outputs the externally applied data to internal circuits 100.1–100.4 via data I/O terminal group 12.

Figure 3:
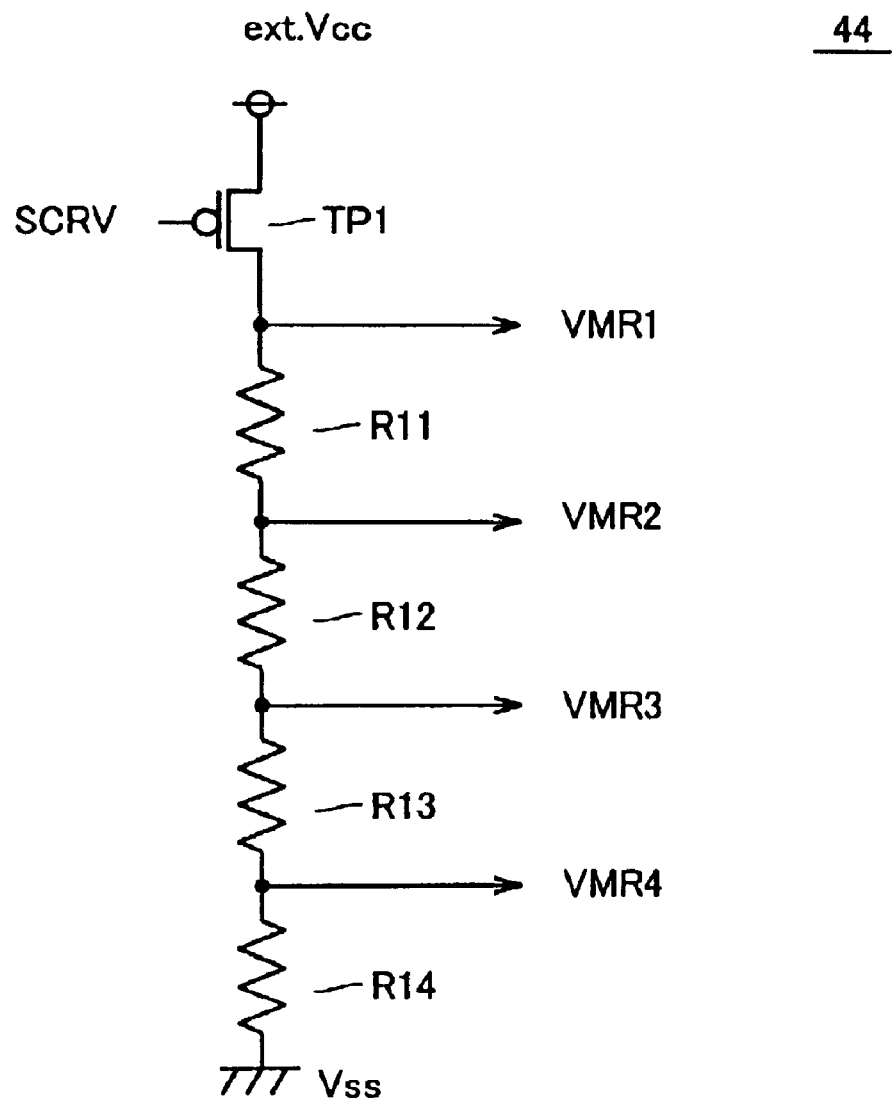
FIG. 3 is a circuit diagram showing a structure of a reference voltage producing portion 44 shown in FIG. 2.

FIG. 3 is a circuit diagram showing a structure of reference voltage producing portion 44 shown in FIG. 2.

Reference voltage producing portion 44 includes a P-channel MOS transistor TP1 and resistors R11–R14, which are connected in series between power supply potential Vcc and ground potential Vss. Transistor TP1 receives on its gate a control signal SCRV from built-in self-test circuit 42, and is on during a period of the built-in self-test.

Reference voltage VMR1 is output from a connection node between transistor TP1 and resistor R11, and reference voltage VMR2 is output from a connection node between resistors R11 and R12. Also, reference voltage VMR3 is output from a connection node between resistors R12 and R13, and reference voltage VMR4 is output from a connection node between resistors R13 and R14.

The resistance values of resistors R11–R14 and resistance ratios between them are predetermined. Therefore, the voltage levels of reference voltages VMR1–VMR4 take predetermined values, respectively.

Figure 4:
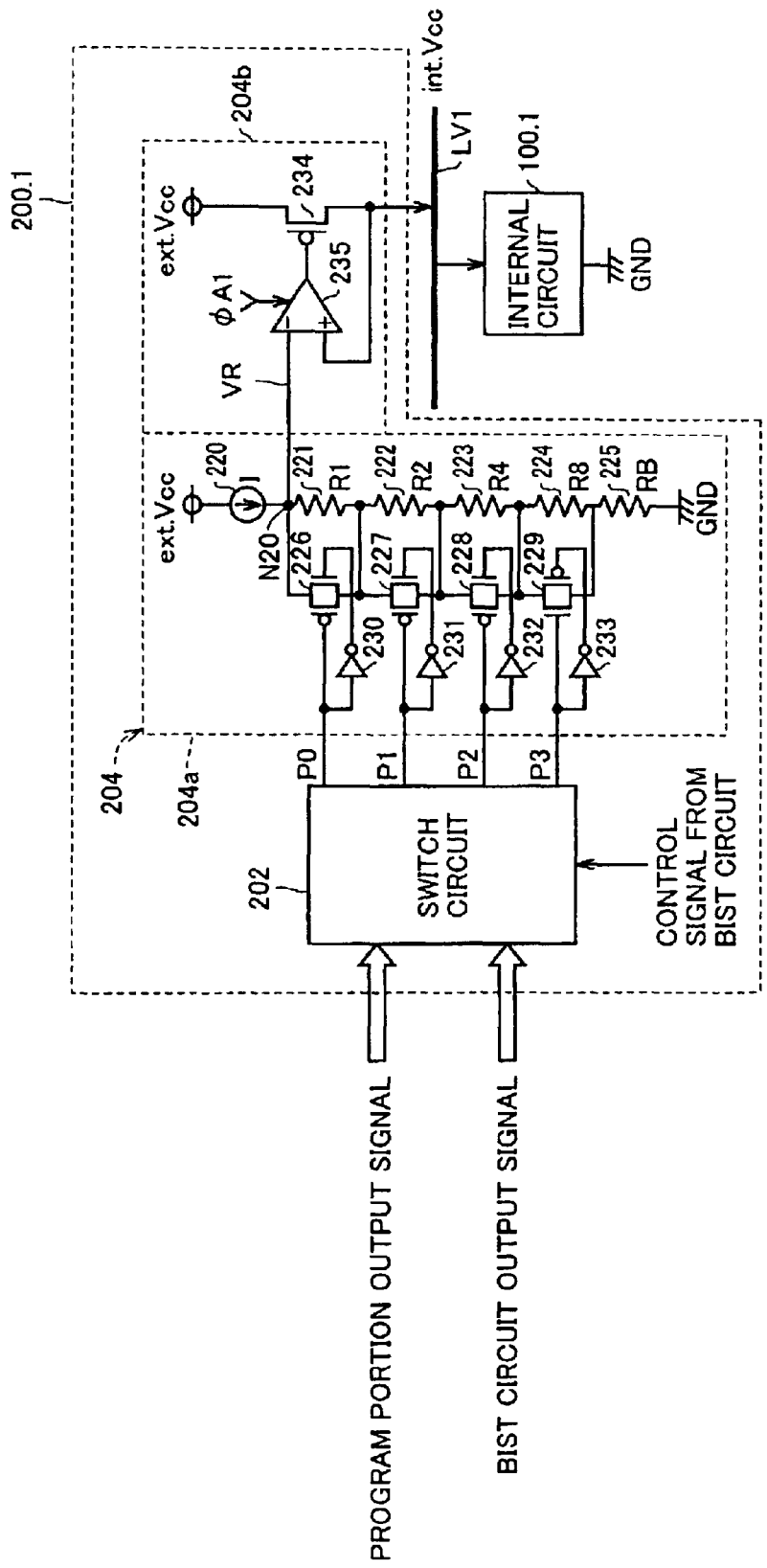
FIG. 4 is a schematic block diagram showing a structure of an internal power supply potential generating circuit 200.1 shown in FIG. 1.

FIG. 4 is a schematic block diagram showing a structure of internal power supply potential generating circuit 200.1 shown in FIG. 1.

Other internal power supply potential generating circuits 200.2–200.4 have basically the same structure as internal power supply potential generating circuit 200.1

Referring to FIG. 4, internal power supply potential generating circuit 200.1 includes a switch circuit 202, which receives a program portion output signal sent from program portion 46 and a BIST circuit output signal sent from built-in self-test circuit (which will be merely referred to "BIST circuit" hereinafter) 42, and selectively outputs the received signals as signals P0–P3 representing the tuning information in accordance with the control signal sent from BIST circuit 42, a reference potential generating circuit 204$a$ for receiving the output of switch circuit 202 and generating the reference potential based on the received output, and a driver circuit 204$b$ for driving the potential level of internal power supply line LV1 in accordance with output voltage VRI of reference potential generating circuit 204$a$.

Reference potential generating circuit 204$a$ includes a constant current source 220, resistance elements 221–225, transfer gates 226–229 and inverters 230–233.

Constant current source 220 is connected between supply interconnection VCL of external power supply potential ext.Vcc and an output node N20, and applies a predetermined constant current I to node N20.

Resistance elements 221–225 are connected in series between output node N20 and supply interconnection VSL of ground potential Vss. Resistance elements 221–225 have predetermined resistance values R1, R2, R4, R8 and RB satisfying a relationship of (R1:R2:R4:R8=1:2:4:8), respectively.

Resistance elements 221–224 are connected in parallel to transfer gates 226–229, respectively. Signals P0–P2 applied from BIST circuit 42 or program portion 46 are directly applied to gates of P-channel MOS transistors of transfer gates 226–228, respectively, and are also applied via inverters 230–232 to gates of N-channel MOS transistors of transfer gates 226–228, respectively. Signal P3 sent from BIST circuit 42 or program portion 46 is directly applied to a gate of an N-channel MOS transistor of transfer gate 229, and is applied to a gate of a P-channel MOS transistor of transfer gate 229 via an inverter 233.

A resistance value R between output node N20 and supply interconnection VSL of ground potential Vss is variable in sixteen steps in accordance with combinations of logical levels of signals P0–P3. For example, when all signals P0–P3 are at "L" level, transfer gates 226–228 are turned on, and transfer gate 229 is turned off so that resistance value R is equal to (R8+RB). This resistance value of (R8+RB) is equal to a designed value, and thus is predetermined. Potential VRI on output nod N20 is equal to (R×I).

Driver circuit 204$b$ includes a P-channel MOS transistor 234 and a differential amplifier 235. P-channel MOS transistor 234 is connected between supply interconnection VSL of external power supply potential ext.Vcc and supply line LV1 of an internal power supply potential int.Vcc. Differential amplifier 235 is controlled by a signal φA1, which is applied from control circuit 40 in control portion 20 during the normal operation, and is applied from built-in self-test circuit 42 in control portion 20 during the test operation. Differential amplifier 25 receives an output potential VRI of reference potential generating circuit 204$a$ on its inverted input node, has a non-inverted input node connected to supply interconnection LVI of internal power supply potential int.Vcc, and supplies its output signal to a gate of P-channel MOS transistor 234.

When signal φA1 is inactive and thus at "L" level, the output signal of differential amplifier 235 is fixed to "H" level, and P-channel MOS transistor 234 is turned off.

When signal φA1 is active and at "H" level, differential amplifier 235 controls the gate potential of P-channel MOS transistor 234 so that internal power supply potential int.Vcc may be equal to reference potential VRI. Therefore, internal power supply potential int.Vcc is equal in level to reference potential VRI.

In FIG. 4, therefore, internal circuit 100.1 is driven by internal power supply potential int.Vcc prepared by lowering external power supply potential ext.Vcc and ground potential Vss.

Figure 5:
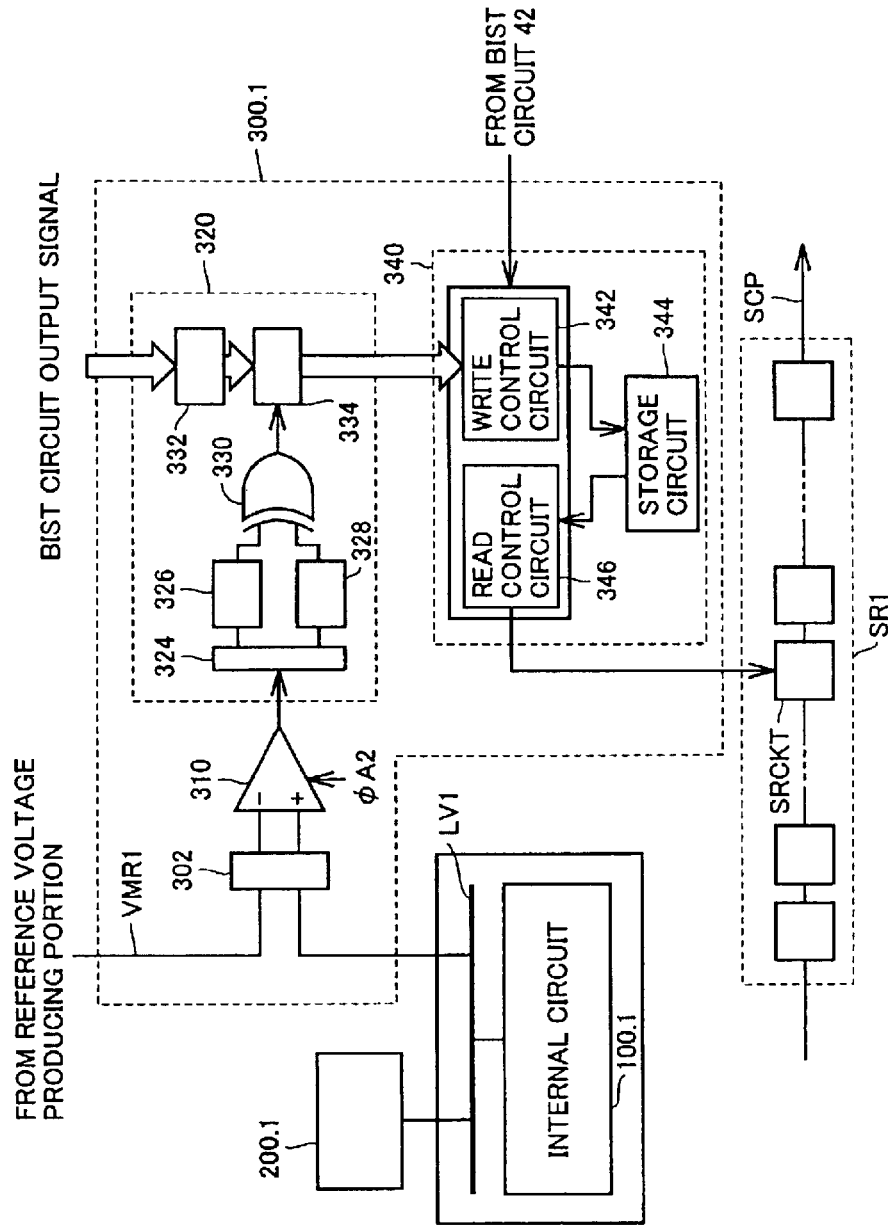
FIG. 5 is a schematic block diagram showing a structure of a measuring circuit 300.1 shown in FIG. 1.

FIG. 5 is a schematic block diagram for showing a structure of measuring circuit 300.1 shown in FIG. 1.

Other measuring circuits 300.2–300.4 have basically the same structure as measuring circuit 300.1.

Measuring circuit 300.1 includes a switch circuit 302, which receives the potential level of internal power supply line LV1 of corresponding internal circuit 100.1 and measuring reference potential VMR1 applied from reference voltage producing portion 44, and passes these potential levels under the control of BIST circuit 42, and a comparator 310, which is activated by a signal φA2 sent from built-in self-test circuit 42 to make a comparison between the level of potential on internal power supply line LV1 applied from switch circuit 302 and measuring reference potential VMR1.

In the test operation, as will be described later, BIST circuit 42 changes stepwise the level of the BIST circuit output signal to be applied to internal power supply potential generating circuit 200.1. Measuring circuit 300.1 receives the BIST circuit output signal from built-in self-test circuit 42. Measuring circuit 300.1 further includes a determining circuit 320 for operating in the test operation based on the output of comparator 310 to detect the time when the BIST circuit output signal attains the predetermined level, and the potential level of internal power supply line LV1 matches with the measuring reference potential VMR1 produced by reference voltage producing portion 44, and thereby selectively outputting the BIST circuit output signal.

Determining circuit 320 includes an interleave circuit 324, latch circuits 326 and 328, EXCLUSIVE-OR gate circuit 330, a latch circuit 332 and a gate circuit 334.

Interleave circuit 324 first applies a "L" level to latch circuit 326, and then applies the output level of comparing circuit 310 alternately to latch circuits 328 and 326. Finally, interleave circuit 324 latches the signal level applied from interleave circuit 324, and applies the same to EXCLUSIVE-OR gate circuit 330.

EXCLUSIVE-OR gate circuit 330 outputs a signal at "L" level when the output levels of latch circuits 326 and 328 match with each other, and otherwise outputs a signal at "H" level.

For example, when the level of the BIST circuit output signal changes in multiple steps, and the output signal of comparator 310 changes from "L" level to "H" level in a certain step, the output level of EXCLUSIVE-OR gate circuit 330 attains "H" level. In the other steps, the output of EXCLUSIVE-OR gate circuit 330 is at "L" level.

In each of the steps where the BIST circuit output signal changes, latch circuit 332 holds its level, and gate circuit 334 outputs BIST circuit output signals PT0–PT3 in response to a rising edge of the output signal of EXCLUSIVE-OR gate 330.

The BIST circuit output signal applied from determining circuit 320 is applied to write control circuit 342 in memory circuit 340. Write control circuit 342 is controlled by BIST circuit 42 to write the BIST circuit output signal applied from determining circuit 320 to a storage circuit 344.

After the measuring operation ends, BIST circuit 42 controls read control circuit 346 to read out the BIST circuit output signal stored in storage circuit 344 therefrom, and stores it in a register SRCKT in shift register circuit SR1 on scan path SCP.

The self-test operation described above can be summarized as follows.

In the normal operation, the program output signal applied from program portion 46 is used for changing the level of reference voltage VRI, which is used for producing internal power supply potential int.Vcc output from internal power supply potential generating circuit 200.1. During the self-test period, however, the BIST circuit output signal applied from BIST circuit 42 is used instead of the foregoing program output signal for changing the level of reference voltage VRI.

Thereby, BIST circuit 42 performs the control to change reference potential level VRI and thereby to change the level of internal power supply potential int.Vcc during the self-test period. Other internal power supply potential generating circuits 200.2–200.4 operate similarly.

Internal power supply potential int.Vcc changed by BIST circuit 42 is compared with reference potentials VMR1–VMR4 applied from reference voltage producing portion 44. Based on the results of this comparison, write control circuit 342 accumulates the BIST circuit output signal, which is output when internal power supply potential int.Vcc attains the level corresponding to the reference potential, in storage circuit 344 on the chip.

In this manner, the measurement is repeated, and the BIST circuit output signal, which is accumulated in storage circuit 344 in accordance with the determination, is serially transmitted through scan path SCP under the control of built-in self-test circuit 42, and is taken into built-in self-test circuit 42.

FIG. 6 shows, by way of example, signals P0–P3 representing the tuning information supplied from program portion 46 or BIST circuit 42, a relative value VRI' of internal reference potential VRI and an output signal φ310 of comparing circuit 310.

In FIG. 6, this tuning mode is conducted in sixteen steps. Signals P3–P0 successively change to 1000, 1001, ..., 1111, 0000, 0001, ... and 0111 in sixteen steps.

Assuming that internal reference potential VRI is equal to 0 when signals P3–P0 are equal to "0000", relative value VRI' of internal reference potential VRI successively changes to –8, –7, ..., –1, 0, 1, ..., +7 in sixteen steps.

Output signal φ310 of comparator 310 is at "L" level in steps 1–6, and is at "H" level in steps 7–16. This means that internal power supply potential int.Vcc is lower than external reference potential VR in steps 1–6, and is higher than external reference potential VR in steps 7–16.

Figure 7:
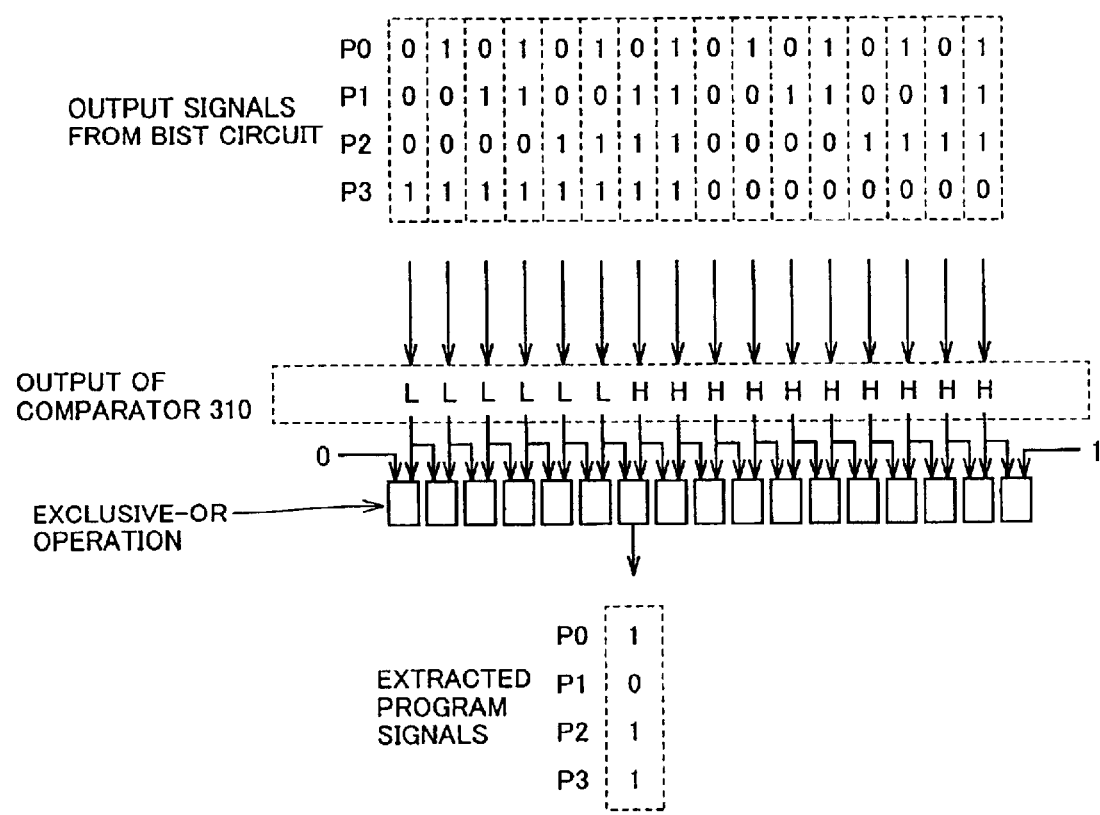
FIG. 7 conceptually shows processing performed by a determining circuit 320 when signals P0–P3 change as shown in FIG. 6.

FIG. 7 conceptually shows processing of determining circuit 320 in the case where signals P0–P3 change as shown in FIG. 6.

Referring to FIG. 7, gate circuit 334 applies signals P0–P3 to memory circuit 340 in response to the rising edge of output signal φ330 of EXCLUSIVE-OR gate 330 in determining circuit 320.

In the case shown in FIG. 6, signals (P3, P2, P1, P0) equal to (1101) in step 6 are applied to memory circuit 340.

Memory circuit 340 stores signals P0–P3 equal to "1101" applied from gate circuit 334, signals P3–P0 equal to "1101" are read out in accordance with the control signal applied from BIST circuit 42, and are successively output to scan path SCP one by one.

Figure 8:
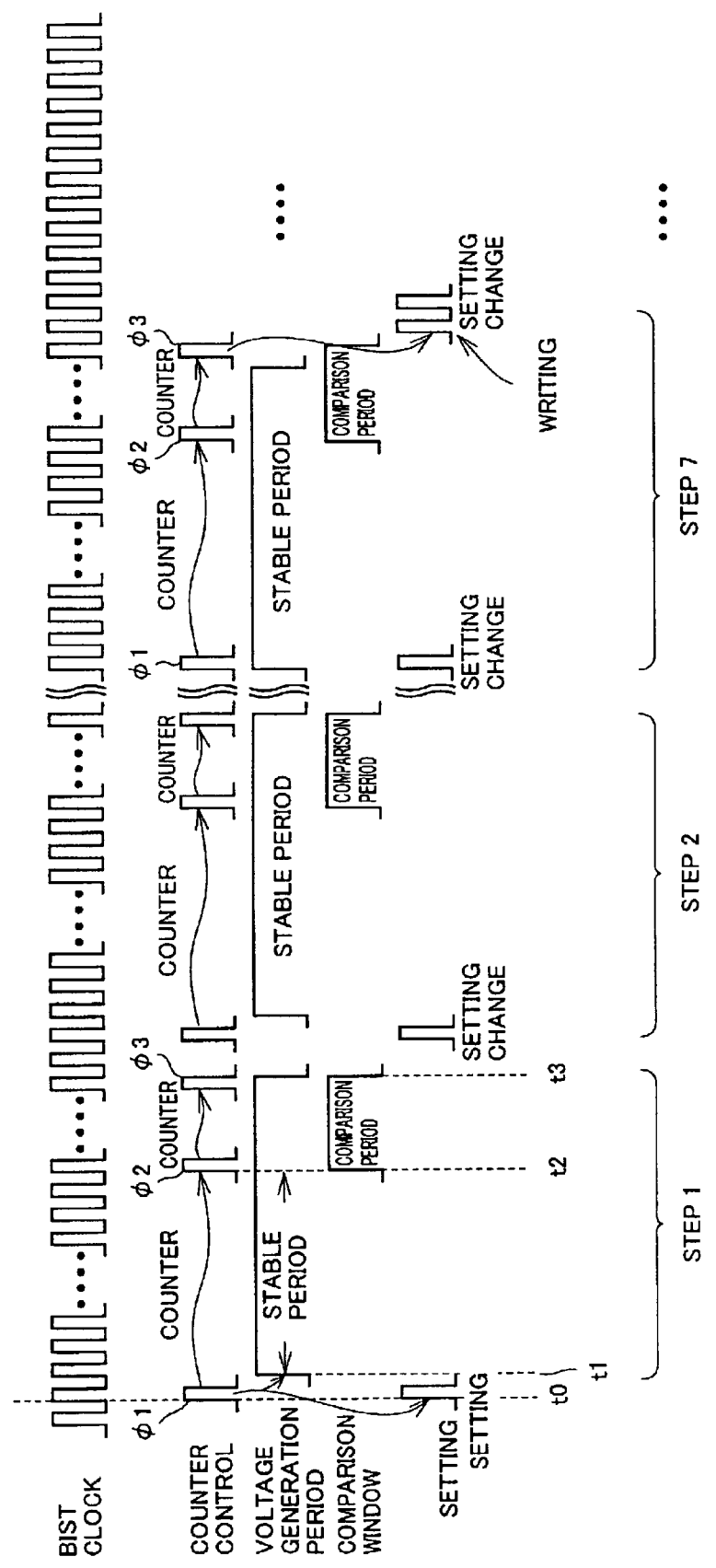
FIG. 8 is a timing chart representing an operation of a self-test of semiconductor integrated circuit device 1000.

FIG. 8 is a timing chart showing an operation of the self-test of semiconductor integrated circuit device 1000.

In FIG. 8, when entry in built-in self-test is set by the external control signal at a certain time t0, a pulse generating circuit (not shown) in built-in self-test circuit 42 raises a signal φ1 for the counter control to "H" level in a pulse-like form.

When signal φ1 rises to "H" level, BIST circuit output signals P3–P1 are set to an initial value, e.g., of "1000", and signal φA1 supplied from BIST circuit 42 rises to "H" level so that differential amplifier 235 becomes active, and the gate potential of P-channel MOS transistor 234 is controlled to provide internal power supply potential int.Vcc matching with internal reference potential VRI. In the built-in self-test, the signals supplied from BIST circuit 42 are applied as signals P0–P3 to internal power supply potential generating circuit 204 via switch circuit 202. In internal power supply potential generating circuit 204 shown in FIG. 4, all transfer gates 226–229 are turned on in response to signals P3–P0 equal to "1000", and internal reference potential VRI attains the lowest level (I×RB).

When signal φ1 is raised to "H" level, a counter (not shown) in BIST circuit 42 starts counting, and signal φ2 is raised to "H" level in a pulse-like form at a time t2 after a predetermined time from time t0. During this period between times t0 and t2, internal power supply potential int.Vcc is stabilized.

When signal φ2 rises to "H" level, signal φA2 is raised to "H" level, and comparing circuit 310 in FIG. 5 is activated. Comparing circuit 310 compares reference potential VMR1 with internal power supply potential int.Vcc, and outputs a signal at a level corresponding to results of the comparison to interleave circuit 324.

When signal φ2 rises to "H" level, the counter (not shown) in BIST circuit 42 restarts the counting to raise a signal φ3 to "H" level in a pulse like manner when a predetermined time elapses from time t2. Signal φ3 falls at a time t3. A comparison between reference potential VMR1 and internal power supply potential int.Vcc is made during a period between times t2 and t3.

In response to the falling edge of signal φ3, signals φA1 and φA2 attain "L" level. Thereby, differential amplifier 235 and comparing circuit 310 are deactivated.

For example, when the signals change as shown in FIG. 6, the output of EXCLUSIVE-OR gate 330 is not activated in step 1 corresponding to signals P3–P0 equal to "1000" so that data is not written into storage circuit 344 via gate circuit 334 and write control circuit 342.

Since the output of EXCLUSIVE-OR gate 330 is not activated even in steps 2–6, data is not written into storage circuit 344 via gate circuit 334 and write control circuit 342.

In step 7, the data representing comparison results of comparing circuit 310 passes through interleave circuit 324 in response to the falling edge of signal φ3, whereby the output of EXCLUSIVE-OR gate 330 becomes active. In response to this, storage circuit 344 is supplied with the BIST circuit output signal via gate circuit 334 and write control circuit 342.

Thereafter, the test is continued also in other internal power supply potential generating circuits 200.2–200.4, which are being tested in parallel, until the end of step 16 for detecting by EXCLUSIVE-OR gate 330 the fact that the data stored in latch circuits 326 and 328 are different from each other. The above test operation can be always continued until the end of the last step (i.e., step 16). Alternatively, the self-test may be ended when the outputs of EXCLUSIVE-OR gates 330 are activated in all internal power supply potential generating circuits 200.2–200.4.

According to the structure of semiconductor integrated circuit device 1000 described above, the value of signals P0–P3 for providing internal power supply potential int.Vcc, which is substantially equal to reference potential VMR1 or the like, is internally obtained by semiconductor integrated circuit device 1000 for each of internal power supply potential generating circuits 200.1–200.4, and is externally output. In the built-in self-test, the optimum value of signals P0–P3 can be easily obtained, and internal power supply potential int.Vcc can be easily tuned.

After the end of the above built-in self-test, processing of blowing off fuses in program portion 46 or processing of writing data into the nonvolatile storage element is performed so that output signals PG0–PG3 of program portion 46 take the optimum value of signals P0–P3 obtained in the built-in self-test, as described before.

In the normal operation, output signals GP0–GP3 of program portion 46 are applied to internal power supply potential generating circuit 204 via switch circuit 202. For example, internal power supply potential generating circuit 204 corresponding to internal circuit 100.1 outputs internal power supply potential int.Vcc at a level substantially equal to that of reference potential VMR1.

In this first embodiment, internal power supply potential int.Vcc is successively increased in the sixteen steps during the built-in self-test. However, the invention is not restricted to this, and internal power supply potential int.Vcc may be successively decreased. Also, internal power supply potential int.Vcc may be successively increased from the reference level (corresponding to VRI' equal to 0 in FIG. 6) to the highest level (corresponding to VRI' equal to +7), and then may be successively decreased from the reference level to the lowest level (corresponding to VRI' equal to −7).

In the structure already described, memory circuits 340 are arranged inside measuring circuits 300.1–300.4, respectively. However, if one (e.g., internal circuit 100.4) of internal circuits 100.1–100.4 is a memory circuit having a function of storing data, such internal circuit 100.4 may be used as memory circuit 340.

[Second Embodiment]

Figure 9:
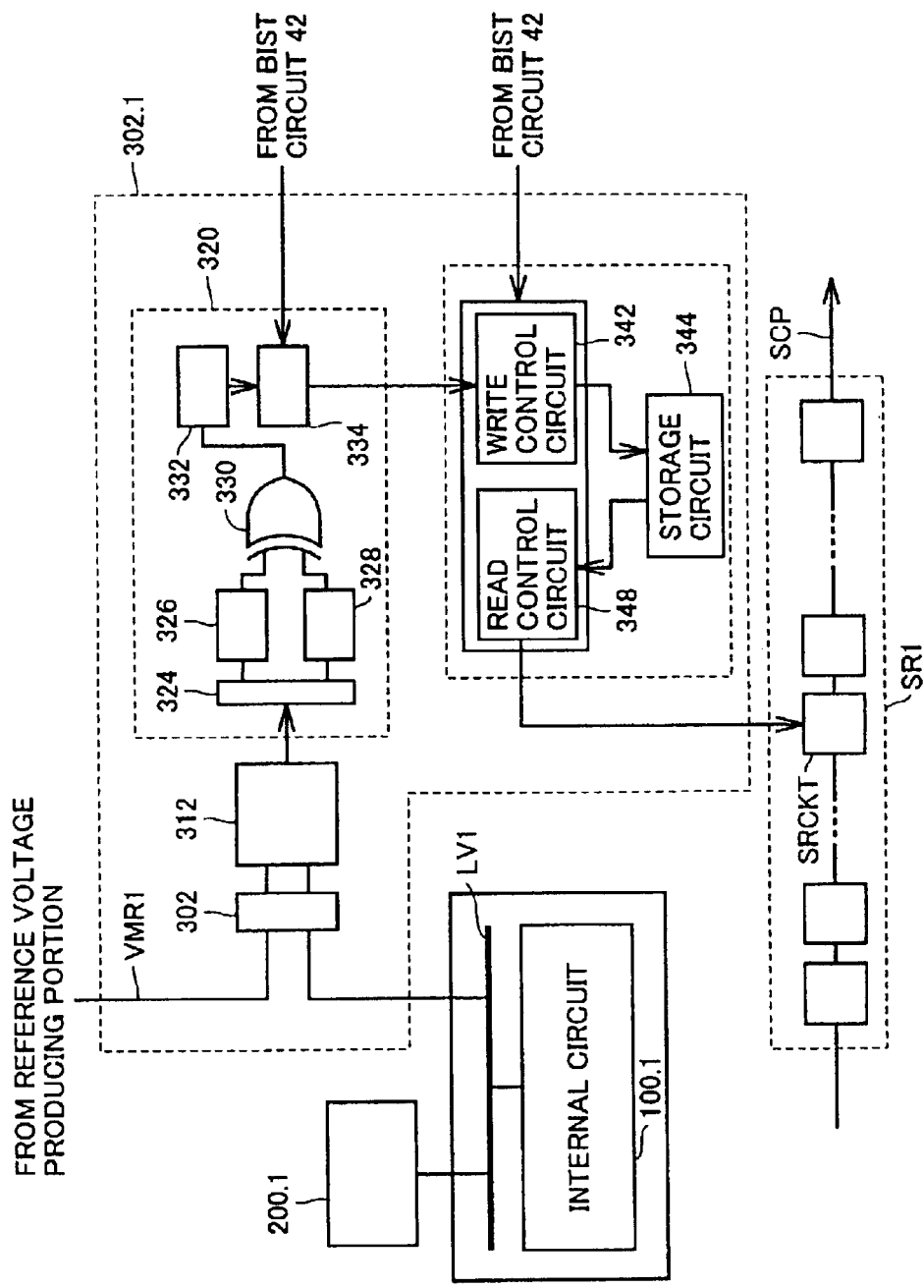
FIG. 9 is a schematic block diagram showing a structure of a measuring circuit 302.1 in semiconductor integrated circuit device 1000 of a second embodiment of the invention.

FIG. 9 is a schematic block diagram for showing a structure of a measuring circuit 302.1 in a semiconductor integrated circuit device 1000 of a second embodiment of the invention, corresponds to FIG. 5 showing the first embodiment. The semiconductor integrated circuit device of the second embodiment is provided with measuring circuits 302.1–302.4 instead of measuring circuits 300.1–300.4 of the first embodiment.

Structures of the semiconductor integrated circuit device of the second embodiment are basically the same as those of semiconductor integrated circuit device 1000 of the first embodiment except for measuring circuits 302.1–302.4, and therefore description thereof is not repeated.

In FIG. 9, the same portions as those in FIG. 5 bear the same reference numbers, and description thereof is not repeated.

Structures of measuring circuit 302.1 in the second embodiment are different from those of measuring circuit 300.1 in the followings.

Comparing circuit 312, which will be described later, is employed for receiving reference potential VMR1 supplied from reference voltage producing portion 44 and the potential on internal power supply interconnection LV1 corresponding to internal circuit 100.1, and making a comparison between them.

Additionally, latch circuit 332 is configured to receive and latch the output of EXCLUSIVE-OR circuit 330 instead of the BIST circuit output signal, and gate circuit 334 applies the data in latch circuit 332 to write control circuit 342 in memory circuit 340 in accordance with an instruction applied from BIST circuit 42.

Accordingly, storage circuit 344 stores the outputs applied from comparator 312 and corresponding to the respective steps 1–16 during the measuring, as will be described later.

A read control circuit 348 is employed instead of read control circuit 346. Read control circuit 348 effects a predetermined arithmetic operation on the output data of comparator 312 held in storage circuit 344, and outputs results of the operation to scan path SCP.

Figure 10:
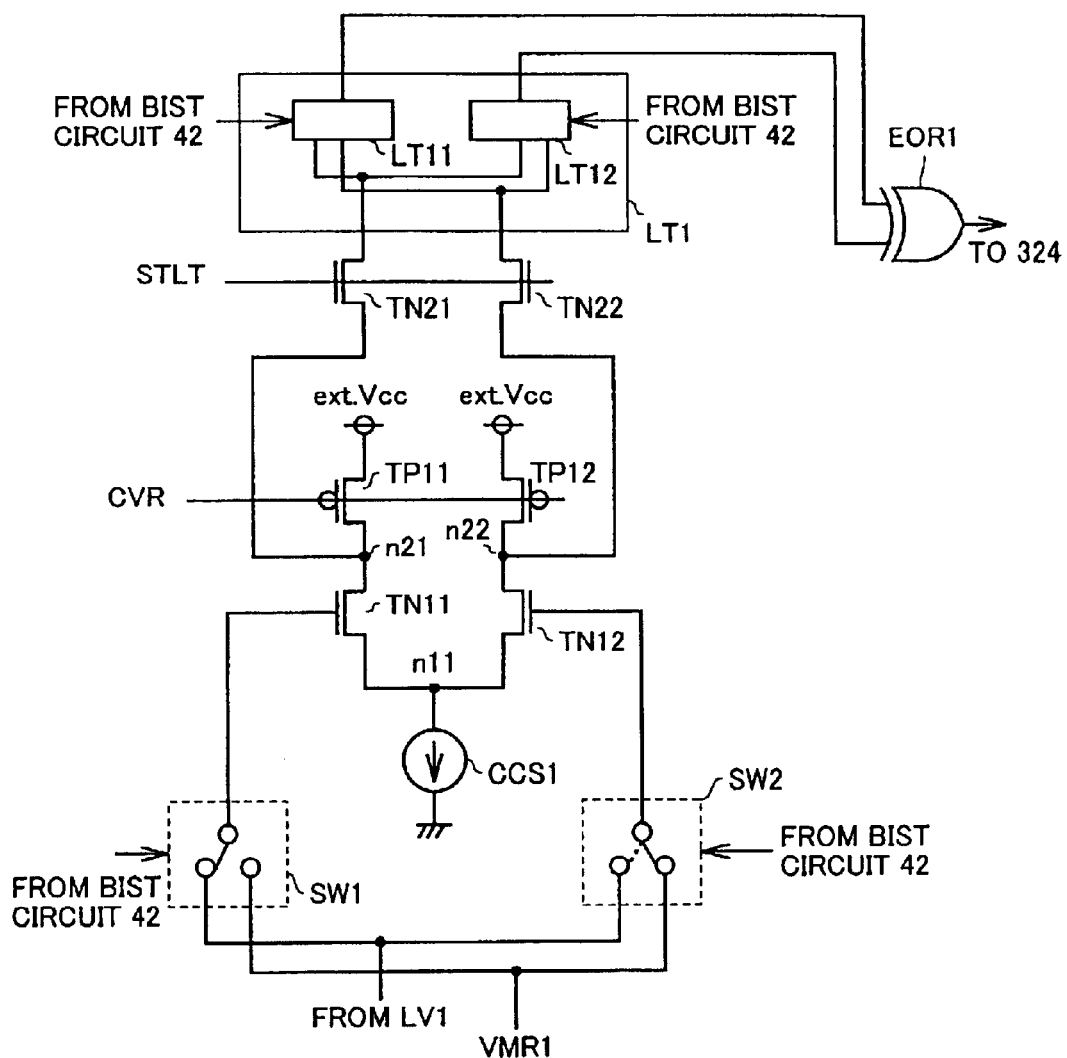
FIG. 10 is a circuit diagram showing a structure of a comparator 312 shown in FIG. 9.

FIG. 10 is a circuit diagram showing a structure of comparator 312 shown in FIG. 9.

Comparator 312 includes a switch circuit SW1, which receives the potential level of internal power supply interconnection LV1 and reference potential VMR1, and selectively outputs these potentials under the control of BIST circuit 42, a switch circuit SW2, which receives the potential level of internal power supply interconnection LV1 and reference potential VMR1, and selectively outputs these potentials under the control of BIST circuit 42, a constant current source CCS1 arranged between an internal node n11 and ground potential Vss, P-channel MOS transistors TP11 and TN11 connected in series between external power supply potential ext.Vcc and internal node n11, and P-channel MOS transistors TP12 and TN12 connected in series between external power supply potential ext.Vcc and internal node n11.

Transistor TN11 receives on its gate an output of switch circuit SW1, and transistor TN12 receives on its gate an output of switch circuit SW2.

Transistors TP11 and TP12 receive a predetermined reference potential CVR.

A connection node between transistors TP11 and TN11 is represented as a node n21, and a connection node between transistors TP12 and TN12 is represented as a node n22. An N-channel MOS transistor TN21 is arranged between node n21 and a latch circuit LT1, and an N-channel MOS transistor TN22 is arranged between node n22 and latch circuit LT1. Gates of transistors TN21 and TN22 are controlled by a latch circuit take-in signal STLT sent from BIST circuit 42.

Latch circuit LT1 includes a latch circuit LT11, which is controlled by BIST circuit 42 to receive the potential level of node n21 applied via transistor TN21 and the potential level of node n22 applied via transistor TN22, and stores the data corresponding to the potential difference level between nodes n21 and n22, and a latch circuit LT12, which is controlled by BIST circuit 42 to hold data corresponding to the potential difference between the potential level of node n22 applied via transistor TN22 and the potential level of node n21 applied via transistor TN21.

For example, switch circuit SW1 is in a position for selecting the potential level of internal power supply interconnection LV1, and switch circuit SW2 is in a position for selecting reference potential VMR1. A potential difference appearing between nodes n21 and n22 in this state is referred to as "results of a comparison in a normal state of inputs". Alternatively, switch circuit SW1 may be in a position for selecting reference potential VMR1, and switch circuit SW2 may be in a position for selecting the potential level of internal power supply interconnection LV1. A potential difference appearing between nodes n21 and n22 in this state is referred to as "results of a comparison in a reverse state of inputs".

Latch circuit LT11 stores the results of comparison of comparator 312 in the normal state of inputs, and latch circuit LT12 stores the results of comparison in the reverse state of inputs.

Comparator 312 further includes an EXCLUSIVE-OR circuit EOR1, which receives data stored in latch circuits LT11 and LT12, and output results of the EXCLUSIVE-OR between them to interleave circuit 324.

In comparator 312 shown in FIG. 10, switch circuits SW1 and SW2 switch the transistors for receiving the potential on the internal power supply interconnection LV1 to be compared and reference potential VMR1, respectively. This processing is performed for the purpose of preventing such a situation that the comparison with sufficient precision cannot be done due to offset of comparison characteristics of comparator 312 caused by variations in characteristics of transistors forming comparator 312 and others.

Figure 11:
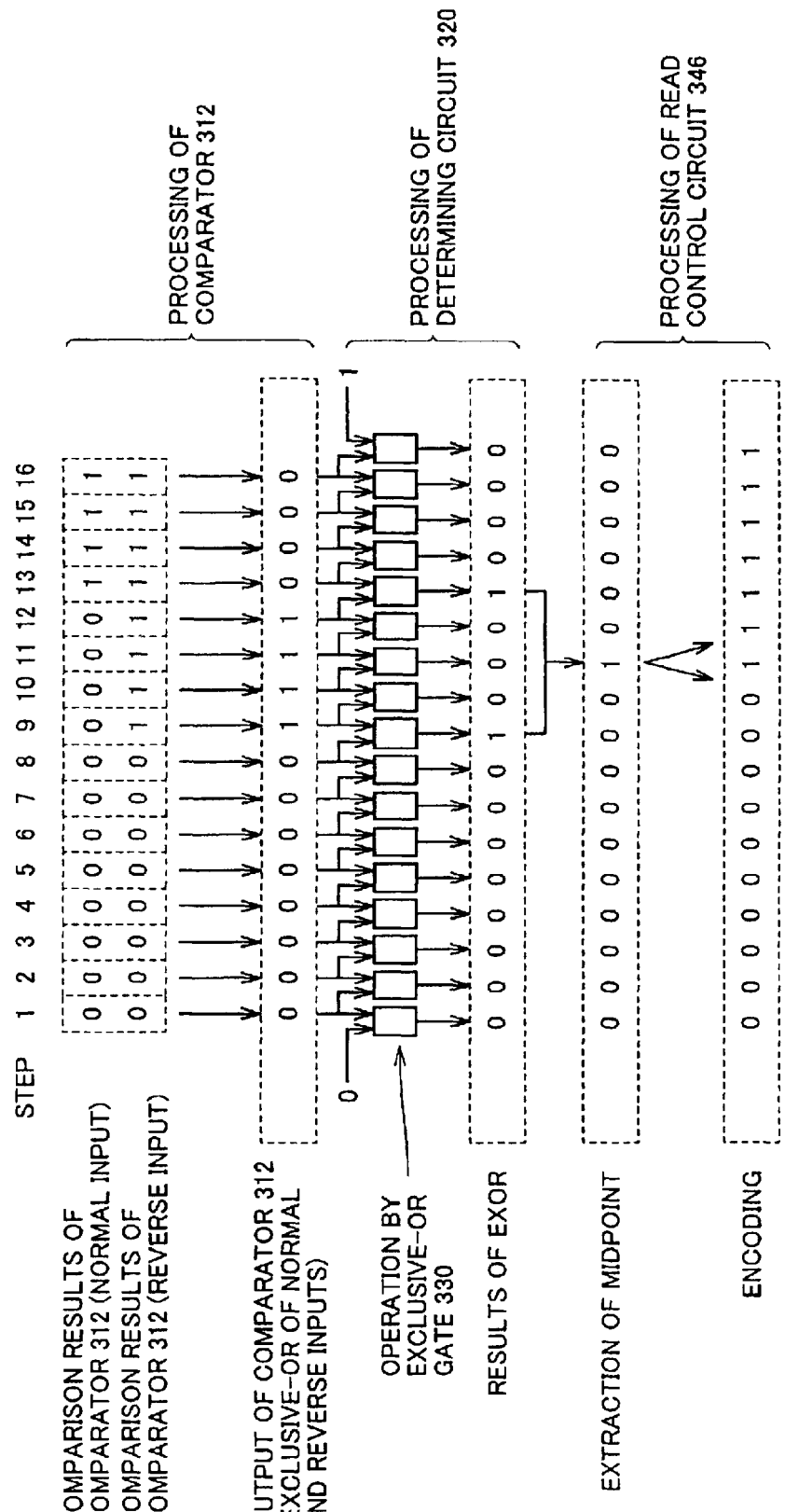
FIG. 11 conceptually represents an operation of a measuring circuit 302.1 of the second embodiment.

FIG. 11 conceptually shows an operation of measuring circuit 302.1 of the second embodiment shown in FIGS. 9 and 10.

As already described, when the levels of signals P0–P3 applied from BIST circuit 42 to internal power supply potential generating circuit 200.1 changes, e.g., in sixteen steps during the self-test mode, the results of comparison in the normal state of inputs as well as the results of comparison in the reverse state of inputs are stored in latch circuits LT11 and LT12 in each step, respectively. In each step, comparator 312 outputs the results of EXCLUSIVE-OR between the data stored in latch circuits LT11 and LT12.

In the example shown in FIG. 11, the results of comparison in the normal state of inputs are opposite to the results of comparison in the reverse state of inputs for a period from step 9 to step 12. In accordance with this, the output of comparator 312 is "1" in the steps 9–12.

The above results of comparison of comparator 312 are subjected to an EXCLUSIVE-OR operation by EXCLUSIVE-OR gate 330 in determining circuit 320, and the output of EXCLUSIVE-OR gate 30 attains a level of "1" when the output level of comparator 312 changes, i.e., when the operation changes from step 8 to step 9, and when it changes from step 12 to step 13.

The output of EXCLUSIVE-OR gate 330 is stored in storage circuit 344 via gate circuit 334.

In the read operation, read control circuit 348 extracts a midpoint of transition points in the two steps, where the output level of EXCLUSIVE-OR gate 330 changes, from the data stored in storage circuit 344. Further, read control circuit 348 applies the encoded data to scan path SCP so that the logical level may change from "0" to "1" at this midpoint.

Owing to the above processing, the accurate results of measurement can be measured by the self-test even in the case where the offset value depends on the comparison results of comparator 312.

[Third Embodiment]

Figure 12:
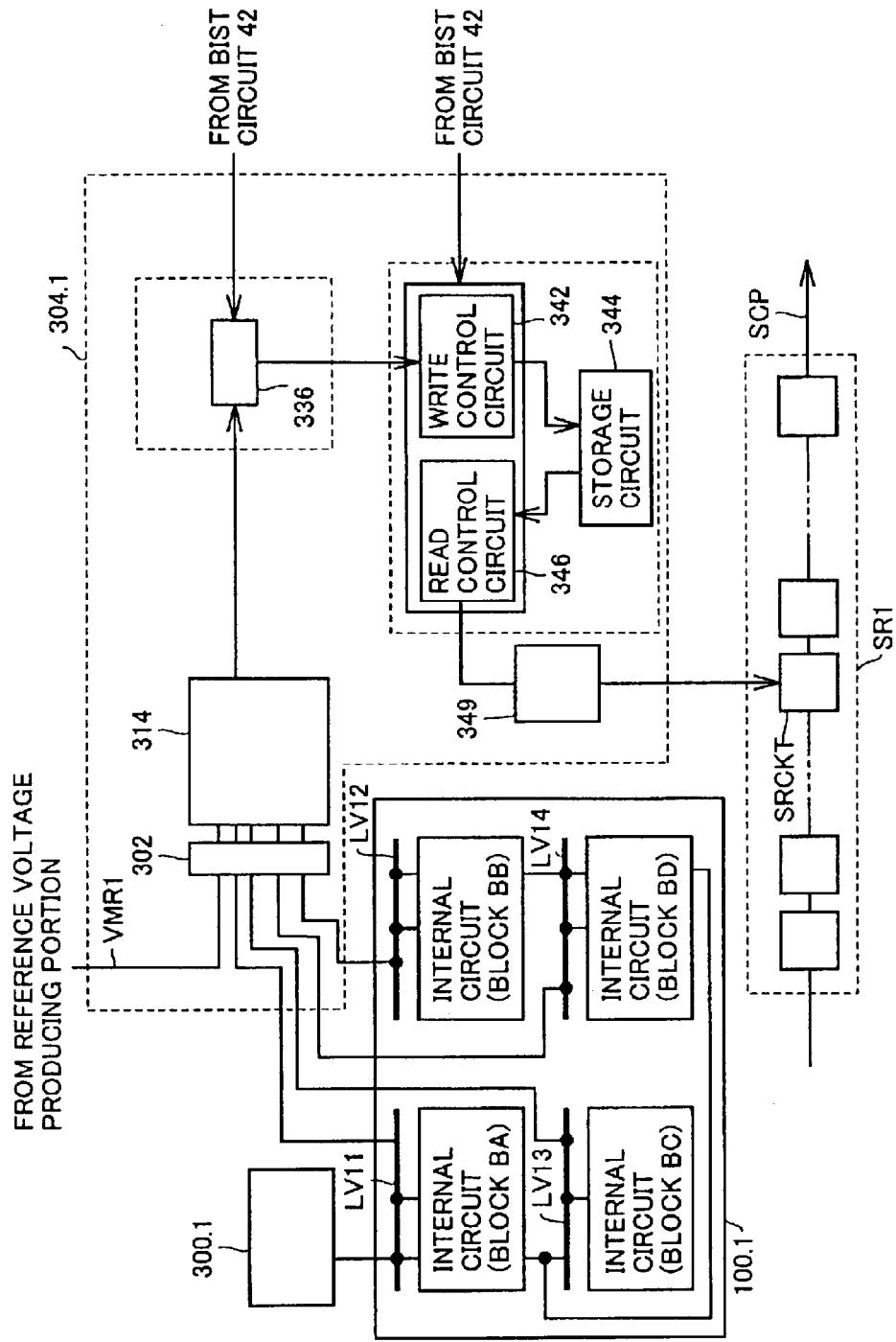
FIG. 12 is a schematic block diagram showing a structure of a measuring circuit 304.1 of a third embodiment of the invention.

FIG. 12 is a schematic block diagram showing a structure of measuring circuit 304.1 of a third embodiment of the invention.

In the third embodiment, the structure of semiconductor integrated circuit device 1000 similar to that of the first embodiment shown in FIG. 1 includes internal circuit 100.1, which is divided, e.g., into four internal circuit blocks BA, BB, BC and BD, and each block is supplied with the internal power supply potential from internal power supply potential generating circuit 200.1.

In the third embodiment having the internal circuit divided into blocks, it is possible to measure the potential level of internal power supply potential int.Vcc for each block, and to output externally the results of measurement.

In the case where the internal power supply potential has a dependence on the position in the external circuit, the value of program signals PG0–PG3 applied to internal power supply potential generating circuit 200.1 is set in view of the position-dependence, as will be described below.

Each of other internal circuits 100.2–100.4 is divided into a plurality of internal circuit blocks, similarly to internal circuit 100.1 shown in FIG. 10.

Referring to FIG. 12, internal power supply interconnections LV11–LV14 supplied with the internal power supply potential from internal power supply potential generating circuit 200.1 are provided corresponding to internal circuit blocks BA–BD, respectively.

Measuring circuit 304.1 includes a switch circuit 302, which receives the potential levels of internal power supply interconnections LV11–LV14 of corresponding internal circuit blocks BA–BD as well as measurement reference potential VMR1 applied from reference voltage producing portion 44, and passes these potential levels under the control of BIST circuit 42, a comparator 314, which compares the potential levels of internal power supply lines LV11–LV14 applied from switch circuit 302 with measurement reference potential VMR1 under the control of built-in self-test circuit 42, and a gate circuit 336, which receives the output of comparator 314, and applies it to write control circuit 342 in accordance with the timing controlled by BIST circuit 42 for storing it in storage circuit 344.

Further, measuring circuit 304.1 includes a logical operation circuit 348 for effecting predetermined an arithmetic operation, which will be described later, on data read from storage circuit 344 by storage control circuit 346, and outputting it to scan path SCP.

Structures other than the above are the same as those of measuring circuit 300.1 of the first embodiment shown in FIG. 5. Therefore, the same portions bear the same reference numbers, and description thereof is not repeated.

Figure 13:
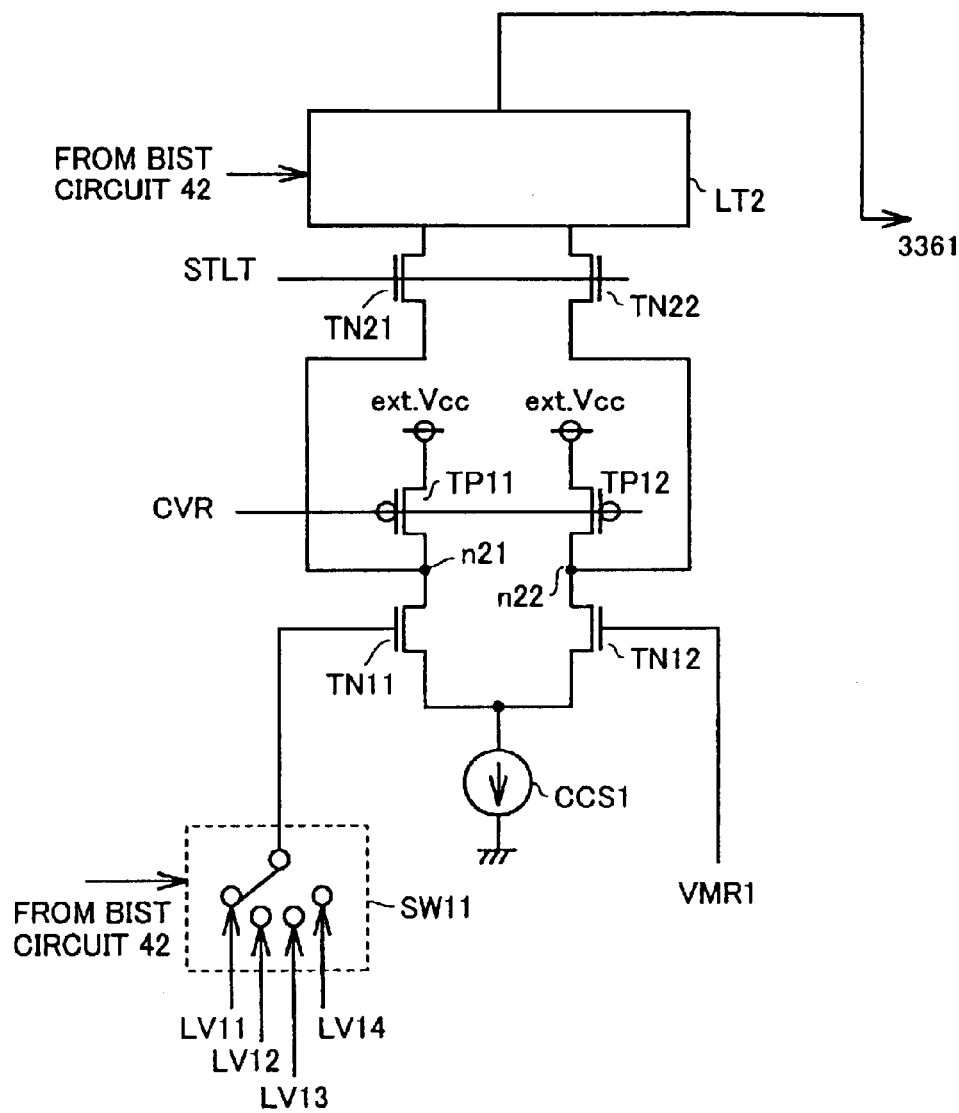
FIG. 13 is a circuit diagram showing a structure of a comparing circuit 314 shown in FIG. 12.

FIG. 13 is a circuit diagram showing a structure of comparing circuit 314 shown in FIG. 12.

Comparing circuit 314 shown in FIG. 13 differs from comparing circuit 312 shown in FIG. 10 in the following points.

First, transistor TN12 always receives measurement reference potential VMR1 on its gate.

Transistor TN11 receives on its gate the potential levels of internal power supply interconnections LV11–LV14 under the control of BIST circuit 42.

A latch circuit LT2, which is provided instead of latch circuit LT1, stores the data corresponding to the potential difference between potential levels of internal nodes n21 and n22, which are applied via transistors TN21 and TN22, respectively, and applies the stored data to gate circuit 336 in accordance with timing controlled by BIST circuit 42.

Structures other than the above are the same as those of comparing circuit 312 shown in FIG. 10. Therefore, the same portions bear the same reference numbers, and description thereof is not repeated.

FIG. 14 conceptually shows an operation of measuring circuit 304.1 of the third embodiment already described with reference to FIGS. 12 and 13.

In each of steps 1–16, comparing circuit 314 outputs the results of comparison for each of internal circuit blocks BA–BD. These results of comparison are stored in storage circuit 344.

For example, in step 8, the result of comparison for internal circuit block BC are "1", and the results of comparison for other internal circuit blocks BA, BB and BD are "0".

Over the period from step 9 to step 12, the internal circuit blocks providing the comparison results of "1" successively increase in number, and the results of comparison for all the internal circuit blocks become equal to "1" in step 13.

A logical operation circuit 348 extracts average values of the results of comparison for respective internal circuit blocks BA–BD over a period from step 8 to step 12, and also extracts the maximum and minimum values of the data to be stored as program signals PG0–PG3 in program portion 46.

More specifically, logical operation circuit 348 outputs the average value to scan path SCP when output of the average value is instructed in accordance with a request by BIST circuit 42. When output of the maximum value is instructed in accordance with the request by BIST circuit 42, logical operation circuit 348 outputs to scan path SCP the serial data, which takes the value of "1" for each of step 13 providing the maximum level of signals P0–P3 and the subsequent steps, and takes the value of "0" for each of the steps before step 13.

When extraction of the minimum value is instructed in accordance with the request by BIST circuit 42, logical operation circuit 348 outputs to scan path SCP the serial data, which takes the value of "0" for each of the steps from step 1 to step 7, and takes the value of "1" for each of step 8 providing the minimum level and the subsequent steps.

According to the structure described above, it is possible to extract by the built-in self-test the data corresponding to the average value as well and the maximum and minimum values corresponding to the program signals for the control of the internal circuit even in the case where the internal circuit is divided into a plurality of blocks, and a distribution of level of internal power supply potential int.Vcc is present in each block.

[Fourth Embodiment]

Figure 15:
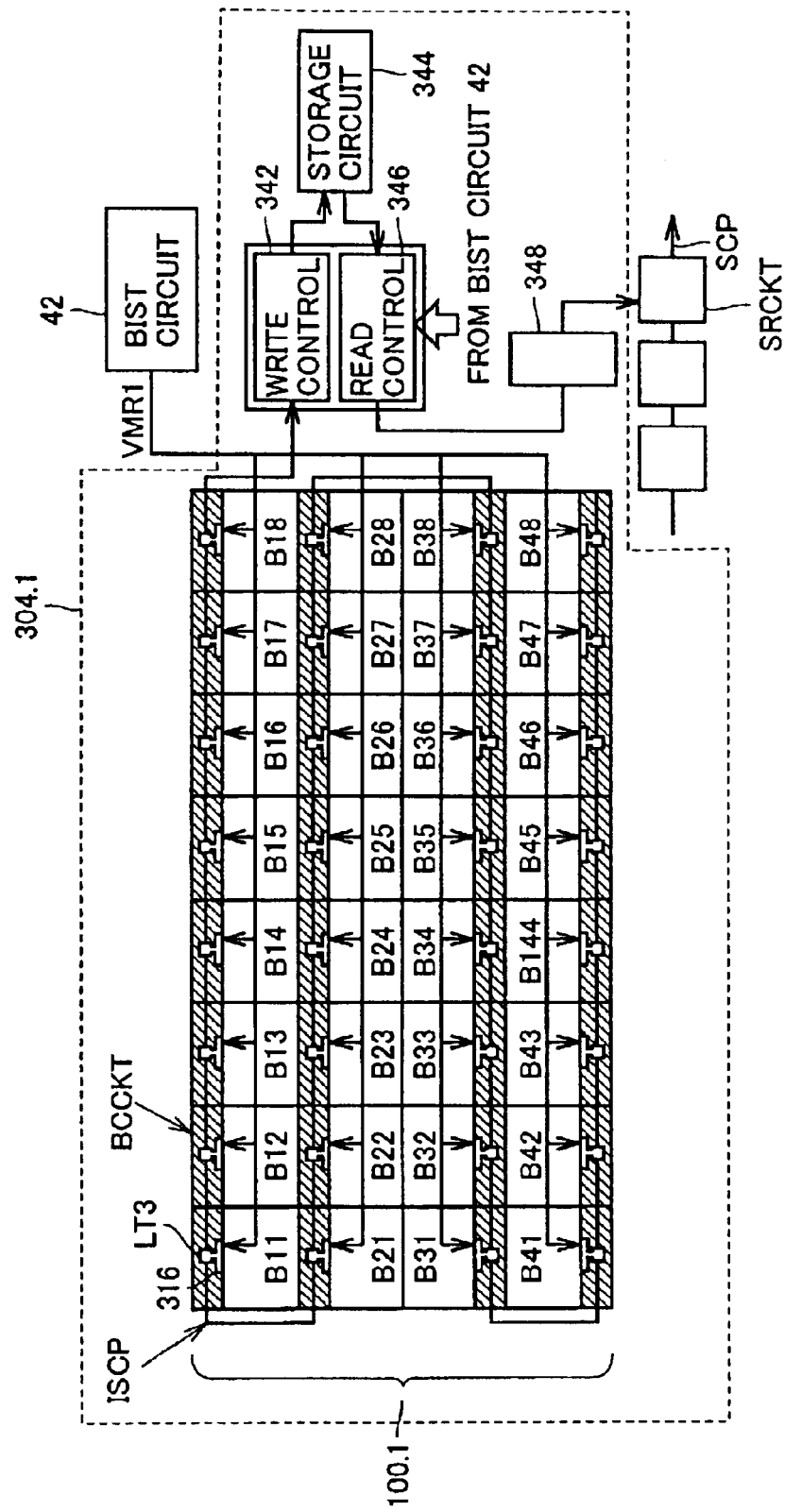
FIG. 15 is a schematic block diagram showing a structure of measuring circuit 304.1.

FIG. 15 is a schematic block diagram showing a structure of measuring circuit 304.1 of a fourth embodiment. In the case where the internal circuit is divided into the internal circuit blocks more than those in the third embodiment, measuring circuit 304.1 can extract the results of comparison of each internal circuit block, and can detect the position-dependence of the internal power supply potential.

In FIG. 15, internal circuit 100.1 is divided into internal circuit blocks B11–B48.

A comparing circuit 316 is provided for each of internal circuit blocks B11–B48, and the results of comparison of comparing circuit 316 are stored in latch circuit LT3 of each comparing circuit 316. Latch circuits LT3 in internal circuit blocks B11–B48 are serially connected, and an internal scan path ISCP serially transmits the results of comparison under the control of BIST circuit 42. The results of comparison transmitted by internal scan path ISCP are stored in storage circuit 344 via write control circuit 342.

BIST circuit 42 applies measurement reference voltage VMR1 to internal circuit 100.1.

Figure 16:
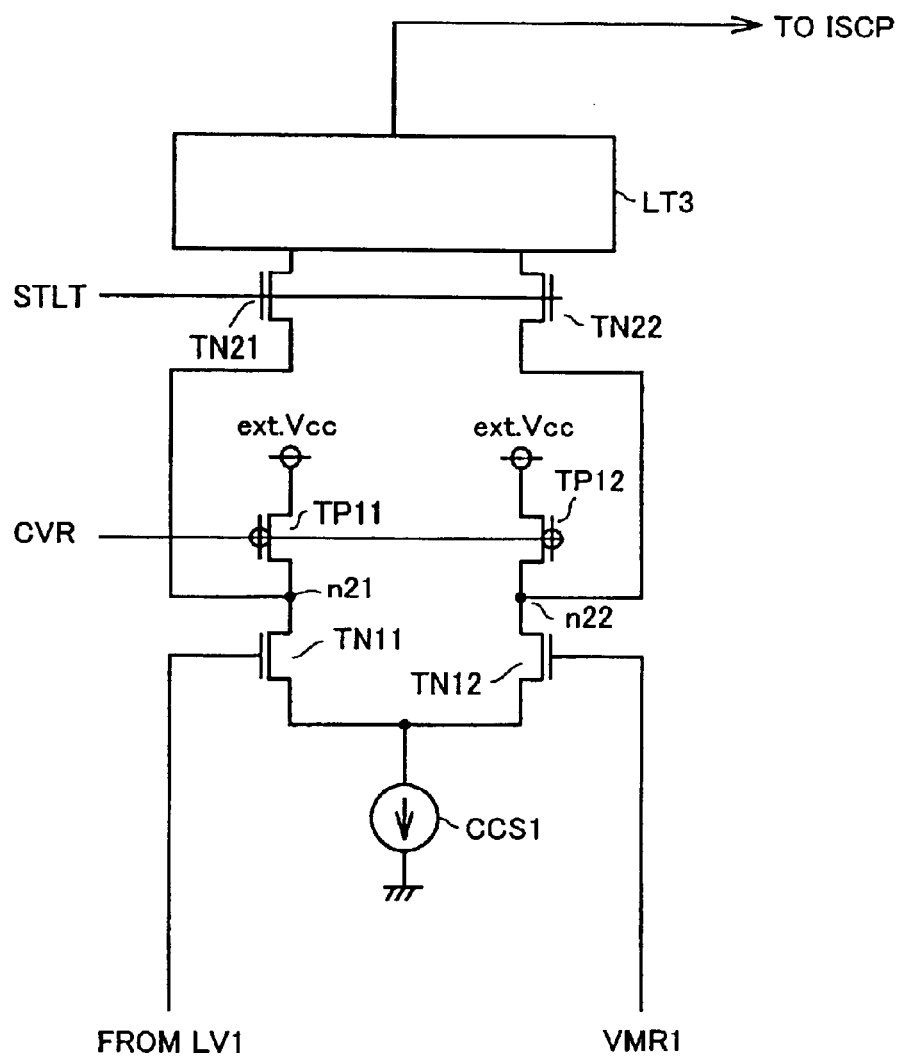
FIG. 16 is a circuit diagram showing a structure of a comparing circuit 316.

FIG. 16 is a circuit diagram showing a structure of comparing circuit 316 shown in FIG. 15.

The structure in FIG. 16 differs from the structure of the comparing circuit of the third embodiment in that switch circuit SW1 is eliminated, and the gate of transistor TN11 in comparing circuit 316 receives only the voltage level of the internal power supply interconnection in the corresponding internal circuit block. Latch circuit LT3 latches the results of comparison made by the above structure, and applies the results to write control circuit 342 via internal scan path ISCP.

FIG. 17 conceptually shows an operation of measuring circuit 304.1 shown in FIGS. 15 and 16.

In each of steps 1–16, write control circuit 342 successively stores the data, which are latched by the plurality of latch circuits LT3 corresponding to internal circuit blocks B11–B48, respectively, in storage circuit 344.

In accordance with first timing during a period of the comparing processing, the data read from latch circuits LT3 corresponding to internal circuit blocks B11–B48 are applied to write control circuit 342, and are written in storage circuit 344. Thereafter, operations are performed similarly to transfer the results of comparison from latch circuits LT3 of internal circuit blocks B11–B48 to write control circuit 342 in accordance with second, third and fourth timing.

From read control circuit 348, the data stored in storage circuit 344 is successively read out, and logical operation circuit 348 performs the processing for each step to obtain the average of the comparison results written in accordance with the respective timing, and to extract the maximum and minimum values for outputting them to scan path SCP similarly to the third embodiment.

Owing to the above structure, the internal circuit can be divided into more internal circuit blocks so that the data relating to the position-dependence of the internal power supply potential can be extracted more specifically.

Figure 18:
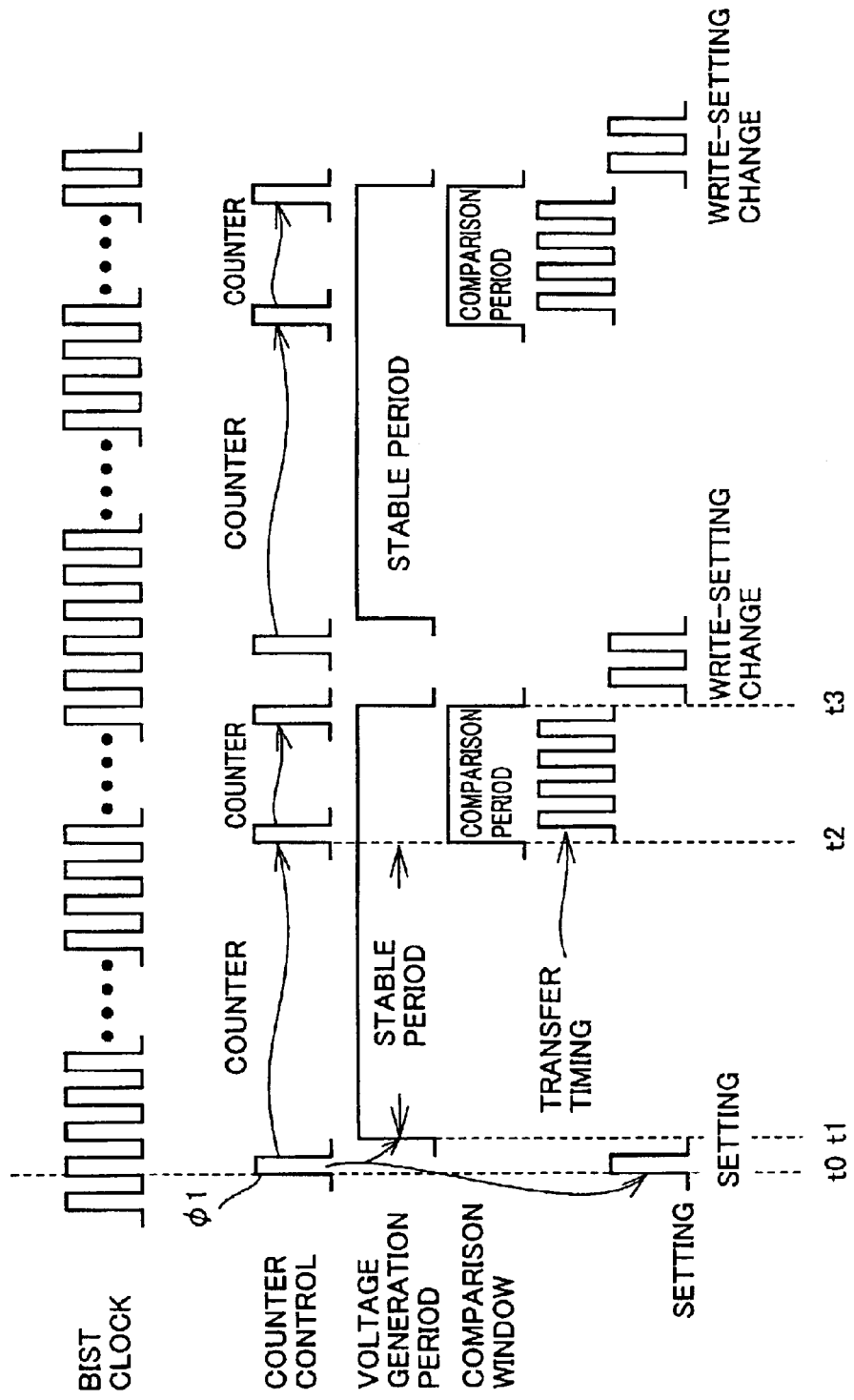
FIG. 18 is a timing chart representing processing shown in FIG. 17.

FIG. 18 is a timing chart representing operations represented in FIG. 17.

The timing in FIG. 18 differs from the processing timing of the first embodiment shown in FIG. 8 in that the results of comparison are transferred to write control circuit 342 at different four points in time during the comparison period.

Operations other than the above are the same as those of the first embodiment, and therefore description thereof is not repeated.

[Fifth Embodiment]

Figure 19:
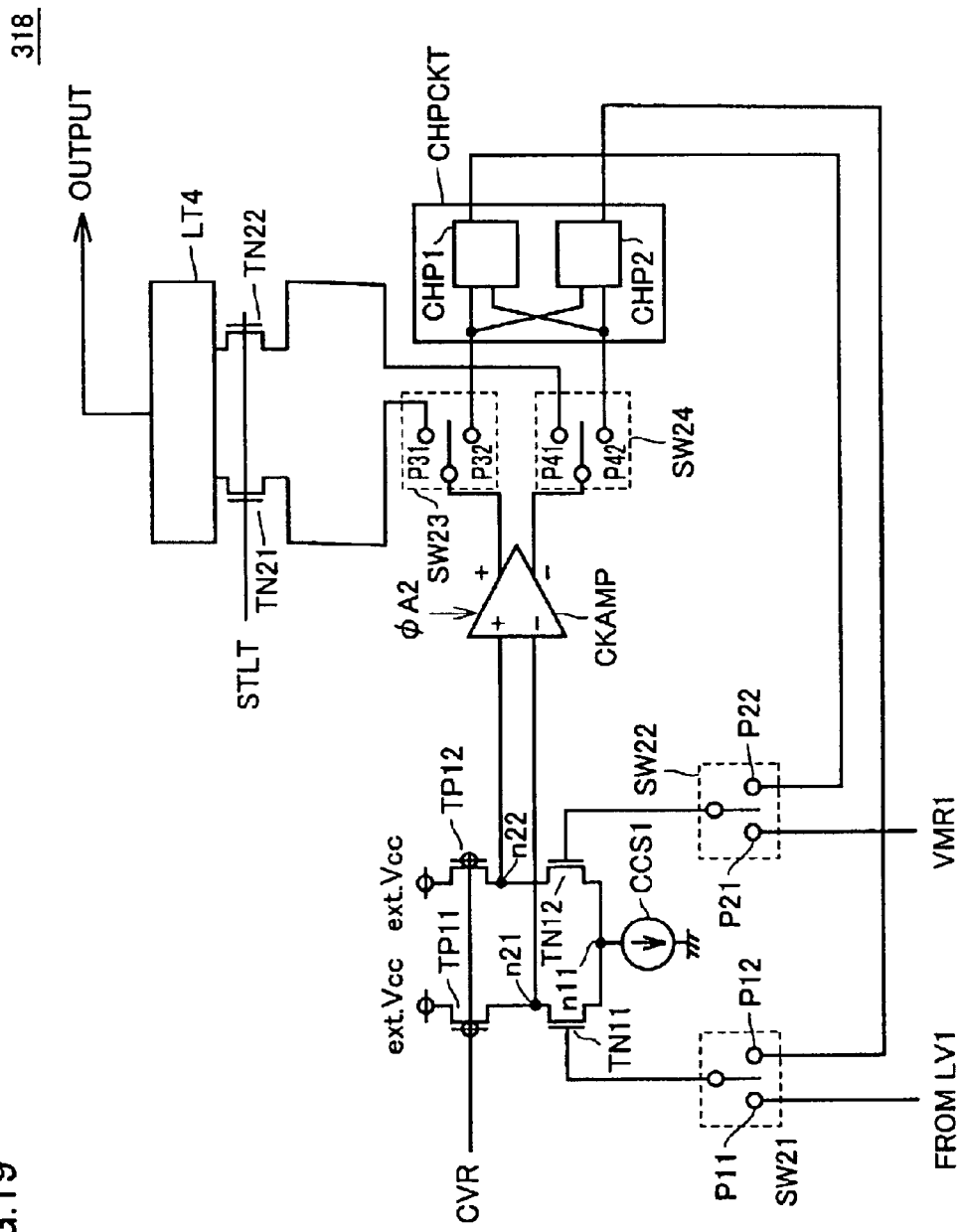
FIG. 19 is a circuit diagram showing a structure of a comparator 318 of a fifth embodiment.

FIG. 19 is a circuit diagram showing a structure of comparator 318 of a fifth embodiment of the invention.

Comparator 318 can be used, e.g., instead of comparator 310 of the first embodiment.

Comparator 318 shown in FIG. 19 is configured to integrate the data of comparison results over a predetermined comparison period.

Operations of comparator 318 can be summarized as follows. During the comparison period, comparator 318 compares the potential on internal power supply interconnection LV1 with measuring reference potential VMR1. An amplifier CKAMP amplifies the results of this comparison, and applies the same to charge pump circuit CHPCKT. Charge pump circuit CHPCKT charges or discharges the complementary internal nodes to produce a potential difference corresponding to the comparison results between these complementary internal nodes. This state is continued for a predetermined period. As a result, the analog potentials on the complementary internal nodes correspond to the value obtained by integrating the comparison results.

Finally, the comparison results are obtained by amplifying the analog potential difference between the complementary internal nodes.

Referring to FIG. 19, comparator 318 includes a switch circuit SW21, which receives on a node p11 a potential level of internal power supply interconnection LV1 of corresponding internal circuit 100.1 (or corresponding internal circuit block), receives on a node p12 a second output of charge pump circuit CHPCKT, and selectively outputs them under the control of BIST circuit 42, a switch circuit SW22, which receives on a node p21 measuring reference potential VMR1, receives on a node p22 the first output of charge pump circuit CHPCKT, and selectively outputs them under the control of BIST circuit 42, constant current source CCS1 arranged between internal node n11 and ground potential Vss, P-channel MOS transistors TP11 and TN11 connected in series between external power supply potential ext.Vcc and internal node n11, P-channel MOS transistors TP12 and TN12 connected in series between external power supply potential ext.Vcc and internal node n11.

Transistor TN11 receives on its gate the output of switch circuit SW21, and transistor TN12 receives on its gate the output of switch circuit SW22.

Transistors TP11 and TP12 receive predetermined reference potential CVR for operation.

Comparator 318 further includes a differential amplifier circuit CKAMP, which is activated by signal φA2 sent from BIST circuit 42, and receives on its non-inverted input node (positive input node) and its inverted input node (negative input node) the potentials on nodes n22 and n21 for amplifying the potential difference between them, respectively, a switch circuit SW23, which receives a non-inverted output (positive output) of differential amplifier circuit CKAMP for outputting the same selectively to nodes p31 and p32 under the control of BIST circuit 42, a switch circuit SW24, which receives the inverted output (negative output) of differential amplifier circuit CKAMP for outputting the same selectively to nodes p41 and p42 under the control of BIST circuit 42, and charge pump circuit CHPCKT, which receives the potential levels of node p32 of switch circuit SW23 and node p42 of switch circuit SW24 for charging or discharging the internal nodes in accordance with the received potential levels.

Charge pump circuit CHPCKT includes a first pump circuit CHP1, which receives the potential levels of nodes p32 and p42 for charging or discharging a first internal node (not shown), and a second pump circuit CHP2, which receives the potential levels of nodes p32 and p42 for charging or discharging a second internal node (not shown) complementarily to first pump circuit CHP1.

Comparator 318 further includes an N-channel MOS transistor TN21 for transmitting the potential level of node p31 of switch circuit SW23 to latch circuit LT4 under the control of signal STLT sent from BIST circuit 42, and an N-channel MOS transistor TN22 for transmitting the potential level of node p41 of switch circuit SW24 to latch circuit LT4 under the control of signal STLT.

During the measuring period, node p11 is selected in switch circuit SW21, and nodes p21, p32 and p42 are selected in switch circuits SW22, SW23 and SW24, respectively.

For storing the comparison results in latch circuit LT4, nodes p12, p22, p31 and p41 are selected in switch circuits SW21, SW22, SW23 and SW24, respectively.

The data stored in latch circuit LT4 forms an output signal of comparator 318.

Figure 20:
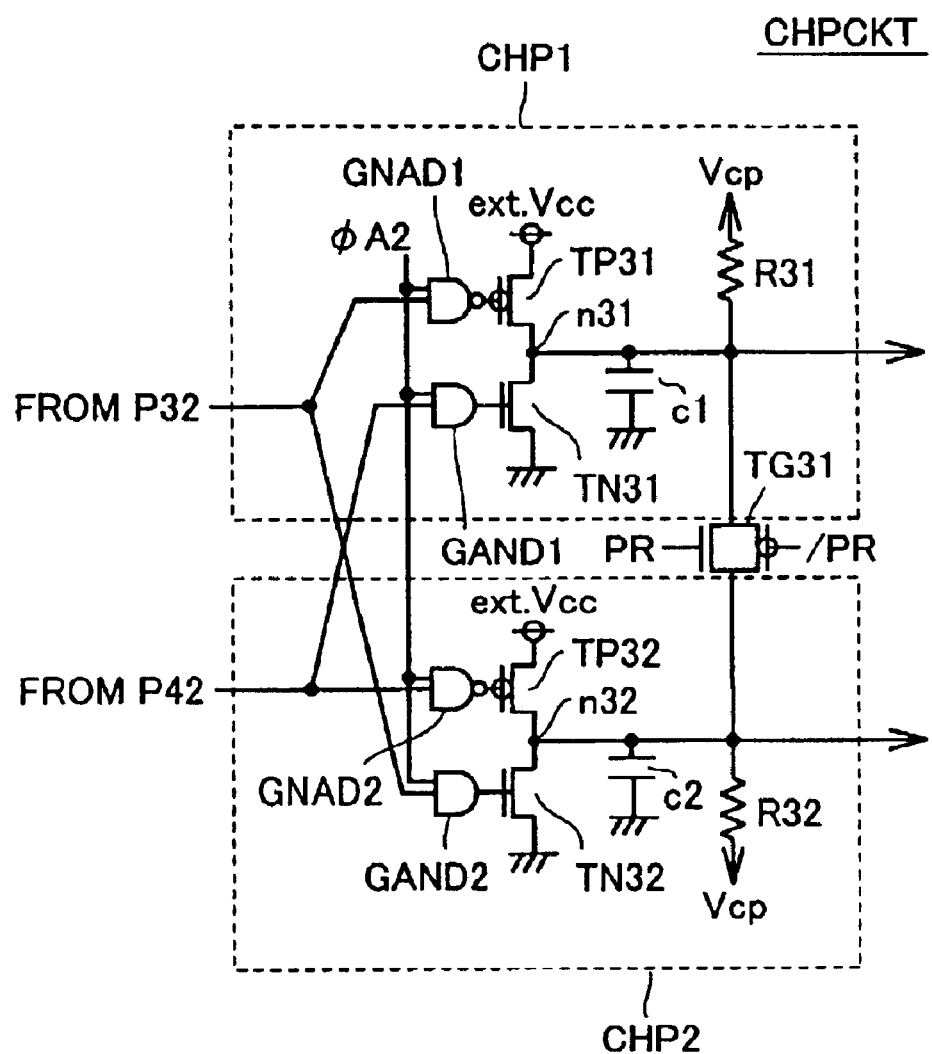
FIG. 20 is a circuit diagram showing structures of first and second pump circuits CHP1 and CHP2.

FIG. 20 is a circuit diagram showing structures of first and second pump circuits CHP1 and CP2 shown in FIG. 19.

Referring to FIG. 20, first pump circuit CHP1 includes a NAND circuit GNAD1 for receiving signal φA2 on one of its inputs, and receiving on the other input the potential on node p32, an AND circuit GAND1 for receiving signal φA2 on one of its inputs, and receiving on the other input the potential on node p42 on the other input, and P- and N-channel MOS transistors TP31 and TN31 connected in series between external power supply potential ext.Vcc and ground potential Vss. Transistor TP31 receives on its gate the output of NAND circuit GNAD1, and transistor TN31 receives on its gate the output of AND circuit GAND1.

First pump circuit CHP1 further includes a capacitor C1 arranged between a connection node n31, which is formed between transistors TP31 and TN31, and ground potential Vss, and a resistor R31 arranged between node n31 and precharge potential Vcp.

Likewise, second pump circuit CHP2 includes a NAND circuit GNAD2 for receiving signal φA2 on one of its inputs, and receiving on the other input the potential on node p42, an AND circuit GAND2 for receiving signal φA2 on one of its inputs, and receiving on the other input the potential on node p32, and P- and N-channel MOS transistors TP32 and TN32 connected in series between external power supply potential ext.Vcc and ground potential Vss. Transistor TP32 receives on its gate the output of NAND circuit GNAD2, and transistor TN32 receives on its gate the output of AND circuit GAND2.

Second pump circuit CHP2 further includes a capacitor C2 arranged between a connection node n32, which is formed between transistors TP32 and TN32, and ground potential Vss, and a resistor R32 arranged between node n32 and precharge potential Vcp.

Node n31 corresponds to the "first internal node", and node n32 corresponds to the "second internal node".

Charge pump circuit CHPCKT includes a transfer gate TG31 for coupling nodes n31 and n32 together under the control of a signal PR, which is output from BIST circuit 42, and becomes active ("H" level) before start of the comparing operation, and its inverted signal /PR.

FIG. 21 is a timing chart for representing the operation of comparator 318 shown in FIGS. 19 and 20.

When the comparison period ends, signal STLT controlling the transfer timing becomes active to perform the transfer of the held data to latch circuit LT4. Except for this, the operations are performed in the same manner as the first embodiment, and therefore description thereof is not repeated.

Owing to the above structure, measurement can be performed while reflecting the results of comparison made for a predetermined period. Thereby, it is possible to improve further the measuring precision and thus the precision of the program signals for internal power supply potential generating circuits 200.1–200.4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
 a plurality of internal circuits;
 at least one internal potential generating circuit provided corresponding to said plurality of internal circuits for generating an internal potential;
 at least one measuring circuit operating in a test operation to compare the internal potential generated by said internal potential generating circuit with a reference potential,
 said measuring circuit including a storage circuit for holding information representing the result of comparison; and
 a transmitting circuit for transmitting said result of comparison stored in said storage circuit.

2. The semiconductor integrated circuit device according to claim 1, wherein
 each of said internal potential generating circuits receives a level set signal including information representing a level of said internal potential, and generates said internal potential at a level corresponding to said level set signal;
 each of said measuring circuits is provided corresponding to said internal potential generating circuit and compares said internal potential generated by said internal potential generating circuit according to said level set signal with the reference potential corresponding to said level set signal in said test operation, and
 said measuring circuits perform in parallel the comparison between said internal potentials and said reference potentials.

3. The semiconductor integrated circuit device according to claim 2, wherein
 said measuring circuit further includes a storing control circuit for selectively storing in said storage circuit the level set signal, among said plurality of level set signals, at the time of detection of the fact that said internal potential corresponds to said reference potential.

4. The semiconductor integrated circuit device according to claim 2, wherein
 said measuring circuit further includes a comparing circuit for comparing the internal potential supplied from said internal potential generating circuit to said internal circuit with said reference potential, and holding results of the comparison,
 said comparing circuit performs a plurality of times the comparison between the internal potential supplied from said internal potential generating circuit to said internal circuit and said reference potential during a predetermined time period, and
 said storage circuit stores said results of comparison while correlating said results with said plurality of level set signals for each operation of performing the comparison said plurality of times by said comparing circuit.

5. The semiconductor integrated circuit device according to claim 2, wherein
 each of said plurality of measuring circuits integrates the results of comparison made between the internal potential supplied from said internal potential generating circuit to said internal circuit and said reference potential over a predetermined time period.

6. The semiconductor integrated circuit device according to claim 1, further comprising:
 a test control circuit for controlling said test operation and outputting said level set signals in said test operation;
 a program circuit for storing said level set signal to be applied to each of said internal potential generating circuits in a normal operation, wherein
 each of said internal potential generating circuits includes a circuit for selecting one of said level set signal applied from said program circuit and said level set signal applied from said test control circuit in accordance with an operation mode.

7. The semiconductor integrated circuit device according to claim 1, wherein
 each of said measuring circuits includes:
 a comparing circuit for receiving the internal potential generated by said internal potential generating circuit and said reference potential on first and second input nodes thereof, respectively, and outputting the results of comparison, and
 a switch circuit capable of switching the potentials applied to said first and second input nodes between said internal potential and said reference potential.

8. The semiconductor integrated circuit device according to claim 1, wherein said internal circuit is divided into a plurality of circuit blocks; and said measuring circuit includes:

a comparing circuit provided commonly to said plurality of circuit blocks for outputting results of a comparison made between an internal potential supplied from said internal potential generating circuit to said plurality of circuit blocks and said reference potential, and a switch circuit controlled by said test control circuit for selectively applying the internal potential to be supplied to said plurality of circuit blocks to said comparing circuit.

9. The semiconductor integrated circuit device according to claim 8, wherein said storage circuit stores said results of comparison for each group including said plurality of circuit blocks of said internal circuit.

10. The semiconductor integrated circuit device according to claim 1, wherein said internal circuit is divided into a plurality of circuit blocks; and said measuring circuit further includes:

a plurality of comparing circuits provided corresponding to said plurality of circuit blocks for comparing the internal potentials supplied from said internal potential generating circuit to said plurality of circuit blocks with said reference potential, and holding results of the comparison, and an internal transmitting circuit for transmitting said results of comparison held by said plurality of comparing circuits to said storage circuit under the control of said test control circuit.

11. A semiconductor integrated circuit device comprising:

an internal circuit divided into a plurality of circuit blocks;

an internal potential generating circuit provided corresponding to said internal circuit for generating an internal potential;

a measuring circuit operating in a test operation to compare the internal potential generated by said internal potential generating circuit with a reference potential, said measuring circuit including a plurality of comparing circuits each provided corresponding to one of said plurality of circuit blocks for comparing the internal potentials supplied from said internal potential generating circuit to said plurality of circuit blocks with said reference potential; and a transmitting circuit for transmitting the results of comparison from said plurality of comparing circuits.

12. The semiconductor integrated circuit device according to claim 11, wherein said measuring circuit further includes a storage circuit for holding information representing the result of comparison.

13. A semiconductor integrated circuit device comprising:

an internal circuit;

at least one internal potential generating circuit provided corresponding to said internal circuit for generating an internal potential;

at least one measuring circuit operating in a test operation to compare the internal potential generated by said internal potential generating circuit with a reference potential for a predetermined time period; and a transmitting circuit for transmitting the result of comparison from said measuring circuit.

14. The semiconductor integrated circuit device according to claim 13, wherein said measuring circuit includes a comparing circuit for comparing the internal potential supplied from said internal potential generating circuit to said internal circuit with said reference potential, and said comparing circuit performs a plurality of times the comparison between the internal potential supplied from said internal potential generating circuit to said internal circuit and said reference potential during said predetermined time period.

15. The semiconductor integrated circuit device according to claim 13, wherein said measuring circuit includes a comparing circuit for comparing the internal potential supplied from said internal potential generating circuit to said internal circuit with said reference potential, said comparing circuit performs a plurality of times the comparison between the internal potential supplied from said internal potential generating circuit to said internal circuit and said reference potential during said predetermined time period, and a storage circuit stores the results of comparison from said comparing circuit for each operation of performing the comparison said plurality of times by said comparing circuit.

16. The semiconductor integrated circuit device according to claim 13, wherein said measuring circuit includes a comparing circuit for comparing the internal potential supplied from said internal potential generating circuit to said internal circuit with said reference potential, and said measuring circuit integrates the results of comparison made between the internal potential supplied from said internal potential generating circuit to said internal circuit and said reference potential over said predetermined time period.

* * * * *